(12) United States Patent
Vanhille et al.

(10) Patent No.: US 10,847,469 B2
(45) Date of Patent: Nov. 24, 2020

(54) CTE COMPENSATION FOR WAFER-LEVEL AND CHIP-SCALE PACKAGES AND ASSEMBLIES

(71) Applicant: Nuvotronics, Inc., Radford, VA (US)

(72) Inventors: Kenneth J. Vanhille, Cary, NC (US); Aaron C. Caba, Blacksburg, VA (US); Masud Beroz, Apex, NC (US); Jared W. Jordan, Raleigh, NC (US); Timothy A. Smith, Durham, NC (US); Anatoliy O. Boryssenko, Belchertown, MA (US); Steven E. Huettner, Tucson, AZ (US)

(73) Assignee: CUBIC CORPORATION, San Diego, CA (US)

( * ) Notice: Subject to any disclaimer, the term of this patent is extended or adjusted under 35 U.S.C. 154(b) by 0 days.

(21) Appl. No.: 15/651,531

(22) Filed: Jul. 17, 2017

(65) Prior Publication Data

US 2017/0330836 A1 Nov. 16, 2017

Related U.S. Application Data

(63) Continuation-in-part of application No. 15/498,188, filed on Apr. 26, 2017, now abandoned.

(51) Int. Cl.
*H01L 23/48* (2006.01)
*H01L 23/538* (2006.01)
(Continued)

(52) U.S. Cl.
CPC ...... *H01L 23/5386* (2013.01); *H01L 21/6836* (2013.01); *H01L 21/78* (2013.01); *H01L 23/13* (2013.01); *H01L 23/528* (2013.01); *H01L 24/48* (2013.01); *H01L 24/73* (2013.01); *H01L 24/96* (2013.01); *H01L 21/561* (2013.01);
(Continued)

(58) Field of Classification Search
None
See application file for complete search history.

(56) References Cited

U.S. PATENT DOCUMENTS 2,743,505 A 5/1956 George
2,812,501 A 11/1957 Sommers
(Continued)

FOREIGN PATENT DOCUMENTS

CA 2055116 A1 5/1992
DE 3623093 A1 1/1988
(Continued)

OTHER PUBLICATIONS

"Multiplexer/LNA Module using PolyStrata®," GOMACTech-15, Mar. 26, 2015.
(Continued)

*Primary Examiner* — Ida M Soward
(74) *Attorney, Agent, or Firm* — Niels Haun; Dann, Dorfman, Herrell & Skillman

(57) ABSTRACT

A microelectronic structure having CTE compensation for use in wafer-level and chip-scale packages, comprising a plurality of substrate tiles each having a generally planar upper surface, the upper surfaces of the tiles disposed within a common plane to provide a generally planar grid of the tiles, each respective pair of adjacent tiles having a gap disposed therebetween.

37 Claims, 9 Drawing Sheets

(51) Int. Cl.
*H01L 23/13* (2006.01)
*H01L 23/52* (2006.01)
*H01L 21/68* (2006.01)
*H01L 21/78* (2006.01)
*H01L 23/528* (2006.01)
*H01L 23/00* (2006.01)
*H01L 21/683* (2006.01)
H01L 23/31 (2006.01)
H01L 21/56 (2006.01)

(52) U.S. Cl.
CPC ......... *H01L 23/3114* (2013.01); *H01L 23/562* (2013.01); *H01L 24/09* (2013.01); *H01L 24/13* (2013.01); *H01L 24/17* (2013.01); *H01L 24/49* (2013.01); *H01L 2221/68327* (2013.01); *H01L 2221/68345* (2013.01); *H01L 2224/02319* (2013.01); *H01L 2224/02377* (2013.01); *H01L 2224/02381* (2013.01); *H01L 2224/03002* (2013.01); *H01L 2224/0401* (2013.01); *H01L 2224/04042* (2013.01); *H01L 2224/05548* (2013.01); *H01L 2224/05567* (2013.01); *H01L 2224/06181* (2013.01); *H01L 2224/13024* (2013.01); *H01L 2224/4813* (2013.01); *H01L 2224/48091* (2013.01); *H01L 2224/48105* (2013.01); *H01L 2224/49431* (2013.01); *H01L 2224/73207* (2013.01); *H01L 2224/85005* (2013.01); *H01L 2224/96* (2013.01); *H01L 2924/00014* (2013.01); *H01L 2924/15184* (2013.01); *H01L 2924/15311* (2013.01)

(56) References Cited

U.S. PATENT DOCUMENTS

| | | |
|---|---|---|
| 2,914,766 A | 11/1959 | Butler |
| 2,997,519 A | 8/1961 | Hines |
| 3,309,632 A | 3/1967 | Trudeau |
| 3,311,966 A | 4/1967 | Henry |
| 3,335,489 A | 8/1967 | Grant |
| 3,352,730 A | 11/1967 | Murch |
| 3,464,855 A | 9/1969 | Quintana |
| 3,517,847 A | 6/1970 | Williams |
| 3,526,867 A | 9/1970 | Keeler |
| 3,537,043 A | 10/1970 | Smith |
| 3,560,896 A | 2/1971 | Essinger |
| 3,577,105 A | 5/1971 | Jones, Jr. |
| 3,598,107 A | 8/1971 | Ishikawa |
| 3,760,306 A | 9/1973 | Spinner |
| 3,775,844 A | 12/1973 | Parks |
| 3,789,129 A | 1/1974 | Ditscheid |
| 3,791,858 A | 2/1974 | Mcpherson |
| 3,884,549 A | 5/1975 | Wang |
| 3,925,883 A | 12/1975 | Cavalear |
| 3,963,999 A | 6/1976 | Nakajima |
| 4,021,789 A | 5/1977 | Furman |
| 4,033,656 A | 7/1977 | Freehauf |
| 4,075,757 A | 2/1978 | Malm |
| 4,275,944 A | 6/1981 | Sochor |
| 4,348,253 A | 9/1982 | Subbarao |
| 4,365,222 A | 12/1982 | Lampert |
| 4,414,424 A | 11/1983 | Mizoguchi |
| 4,417,393 A | 11/1983 | Becker |
| 4,437,074 A | 3/1984 | Cohen |
| 4,521,755 A | 6/1985 | Carlson |
| 4,539,534 A | 9/1985 | Hudspeth |
| 4,581,301 A | 4/1986 | Michaelson |
| 4,591,411 A | 5/1986 | Reimann |
| 4,641,140 A | 2/1987 | Heckaman |
| 4,647,878 A | 3/1987 | Landis |
| 4,663,497 A | 5/1987 | Reimann |
| 4,673,904 A | 6/1987 | Landis |
| 4,684,181 A | 8/1987 | Massit |
| 4,700,159 A | 10/1987 | Jones |
| 4,717,064 A | 1/1988 | Popielarski |
| 4,729,510 A | 3/1988 | Landis |
| 4,771,294 A | 9/1988 | Wasilousky |
| 4,808,273 A | 2/1989 | Hua |
| 4,832,461 A | 5/1989 | Yamagishi |
| 4,853,656 A | 8/1989 | Guillou |
| 4,856,184 A | 8/1989 | Doeling |
| 4,857,418 A | 8/1989 | Schuetz |
| 4,859,806 A | 8/1989 | Smith |
| 4,876,322 A | 10/1989 | Budde |
| 4,880,684 A | 11/1989 | Boss |
| 4,909,909 A | 3/1990 | Florjancic |
| 4,915,983 A | 4/1990 | Lake |
| 4,969,979 A | 11/1990 | Appelt |
| 4,975,142 A | 12/1990 | Iannacone et al. |
| 5,069,749 A | 12/1991 | Gutierrez |
| 5,072,201 A | 12/1991 | Devaux |
| 5,089,880 A | 2/1992 | Meyer |
| 5,100,501 A | 3/1992 | Blumenthal |
| 5,119,049 A | 6/1992 | Heller |
| 5,168,348 A * | 12/1992 | Chu ............... H01L 23/367 257/713 |
| 5,191,699 A | 3/1993 | Ganslmeier |
| 5,213,511 A | 5/1993 | Sobhani |
| 5,227,013 A | 7/1993 | Kumar |
| 5,235,208 A | 8/1993 | Katoh |
| 5,274,484 A | 12/1993 | Mochizuki |
| 5,280,409 A * | 1/1994 | Selna ............... H01L 23/4006 174/16.3 |
| 5,299,939 A | 4/1994 | Walker |
| 5,312,456 A | 5/1994 | Reed |
| 5,334,956 A | 8/1994 | Leding |
| 5,381,157 A | 1/1995 | Shiga |
| 5,391,881 A * | 2/1995 | Jeuch ............... G01T 1/24 250/370.09 |
| 5,406,235 A | 4/1995 | Hayashi |
| 5,406,423 A | 4/1995 | Hayashi |
| 5,430,257 A | 7/1995 | Lau |
| 5,454,161 A | 10/1995 | Beilin |
| 5,529,504 A | 6/1996 | Greenstein |
| 5,622,895 A | 4/1997 | Frank |
| 5,633,615 A | 5/1997 | Quan |
| 5,682,062 A | 10/1997 | Gaul |
| 5,682,124 A | 10/1997 | Suski |
| 5,712,607 A | 1/1998 | Dittmer |
| 5,724,012 A | 3/1998 | Teunisse |
| 5,746,868 A | 5/1998 | Abe |
| 5,793,272 A | 8/1998 | Burghartz |
| 5,814,889 A | 9/1998 | Gaul |
| 5,860,812 A | 1/1999 | Gugliotti |
| 5,872,399 A | 2/1999 | Lee |
| 5,903,059 A | 5/1999 | Bertin |
| 5,925,206 A | 7/1999 | Boyko |
| 5,940,674 A | 8/1999 | Sachs |
| 5,961,347 A | 10/1999 | Hsu |
| 5,977,842 A | 11/1999 | Brown |
| 5,990,768 A | 11/1999 | Takahashi |
| 6,008,102 A | 12/1999 | Alford |
| 6,020,750 A * | 2/2000 | Berger ............... G01R 31/2886 324/756.05 |
| 6,027,630 A | 2/2000 | Cohen |
| 6,054,252 A | 4/2000 | Lundy |
| 6,180,261 B1 | 1/2001 | Inoue |
| 6,183,268 B1 | 2/2001 | Consoli |
| 6,207,901 B1 | 3/2001 | Smith |
| 6,210,221 B1 | 4/2001 | Maury |
| 6,228,466 B1 | 5/2001 | Tsukada |
| 6,232,669 B1 | 5/2001 | Khoury |
| 6,294,965 B1 | 9/2001 | Merrill |
| 6,329,605 B1 | 12/2001 | Beroz |
| 6,350,633 B1 | 2/2002 | Lin |
| 6,388,198 B1 | 5/2002 | Bertin |
| 6,457,979 B1 | 10/2002 | Dove |
| 6,465,747 B2 | 10/2002 | DiStefano |
| 6,466,112 B1 | 10/2002 | Kwon |
| 6,479,744 B1 * | 11/2002 | Tsuzuki ............... H01L 31/02243 136/244 |
| 6,514,845 B1 | 2/2003 | Eng |
| 6,518,165 B1 | 2/2003 | Yoon |

(56) References Cited

U.S. PATENT DOCUMENTS

| | | |
|---|---|---|
| 6,535,088 B1 | 3/2003 | Sherman |
| 6,589,594 B1 | 7/2003 | Hembree |
| 6,600,395 B1 | 7/2003 | Handforth |
| 6,603,376 B1 | 8/2003 | Handforth |
| 6,648,653 B2 | 11/2003 | Huang |
| 6,662,443 B2 | 12/2003 | Chou |
| 6,677,248 B2 | 1/2004 | Kwon |
| 6,730,933 B1* | 5/2004 | Shimizu .............. H01L 25/0753 257/103 |
| 6,735,009 B2 | 5/2004 | Li |
| 6,746,891 B2 | 6/2004 | Cunningham |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall |
| 6,850,084 B2 | 2/2005 | Hembree |
| 6,888,427 B2 | 5/2005 | Sinsheimer |
| 6,889,433 B1 | 5/2005 | Enomoto |
| 6,914,513 B1 | 7/2005 | Wahlers |
| 6,917,086 B2 | 7/2005 | Cunningham |
| 6,923,249 B1* | 8/2005 | Porter ................... B64G 1/425 136/246 |
| 6,943,452 B2 | 9/2005 | Bertin |
| 6,971,913 B1 | 12/2005 | Chu |
| 6,975,267 B2 | 12/2005 | Stenger |
| 6,981,414 B2 | 1/2006 | Knowles |
| 7,005,750 B2 | 2/2006 | Liu |
| 7,012,489 B2 | 3/2006 | Sherrer |
| 7,030,712 B2 | 4/2006 | Brunette |
| 7,064,449 B2 | 6/2006 | Lin |
| 7,077,697 B2 | 7/2006 | Kooiman |
| 7,084,722 B2 | 8/2006 | Goyette |
| D530,674 S | 10/2006 | Ko |
| 7,116,190 B2 | 10/2006 | Brunker |
| 7,129,163 B2 | 10/2006 | Sherrer |
| 7,148,141 B2 | 12/2006 | Shim |
| 7,148,722 B1 | 12/2006 | Cliff |
| 7,148,772 B2 | 12/2006 | Sherrer |
| 7,165,974 B2 | 1/2007 | Kooiman |
| 7,217,156 B2 | 5/2007 | Wang |
| 7,222,420 B2 | 5/2007 | Moriizumi |
| 7,239,219 B2 | 7/2007 | Brown |
| 7,252,861 B2 | 8/2007 | Smalley |
| 7,259,640 B2 | 8/2007 | Brown |
| 7,383,632 B2 | 6/2008 | Dittmann |
| 7,388,388 B2 | 6/2008 | Dong |
| 7,400,222 B2 | 7/2008 | Kwon |
| 7,405,638 B2 | 7/2008 | Sherrer |
| 7,449,784 B2 | 11/2008 | Sherrer |
| 7,478,475 B2 | 1/2009 | Hall |
| 7,508,065 B2 | 3/2009 | Sherrer |
| 7,532,163 B2 | 5/2009 | Chang |
| 7,555,309 B2 | 6/2009 | Baldor |
| 7,575,474 B1 | 8/2009 | Dodson |
| 7,579,553 B2 | 8/2009 | Moriizumi |
| 7,602,059 B2 | 10/2009 | Nobutaka |
| 7,619,441 B1 | 11/2009 | Rahman |
| 7,628,617 B2 | 12/2009 | Brown |
| 7,645,147 B2 | 1/2010 | Dittmann |
| 7,645,940 B2 | 1/2010 | Shepherd |
| 7,649,432 B2 | 1/2010 | Sherrer |
| 7,656,256 B2 | 2/2010 | Houck |
| 7,658,831 B2 | 2/2010 | Mathieu |
| 7,683,842 B1 | 3/2010 | Engel |
| 7,705,456 B2 | 4/2010 | Hu |
| 7,741,853 B2 | 6/2010 | Blakely |
| 7,748,440 B2* | 7/2010 | Michel ................... H01L 23/42 165/133 |
| 7,755,174 B2 | 7/2010 | Rollin et al. |
| 7,755,895 B2* | 7/2010 | Ikeda ................... H01L 23/36 165/185 |
| 7,898,356 B2 | 3/2011 | Sherrer |
| 7,948,335 B2 | 5/2011 | Sherrer |
| 8,004,296 B2* | 8/2011 | Di Stefano ........ G01R 31/2891 324/750.19 |
| 8,011,959 B1 | 9/2011 | Tsai |
| 8,031,037 B2 | 10/2011 | Sherrer |
| 8,188,932 B2 | 5/2012 | Worl |
| 8,210,716 B2* | 7/2012 | Lerman ............... H05K 1/0204 362/249.02 |
| 8,232,709 B2* | 7/2012 | Betsuda ................. F21V 23/00 313/46 |
| 8,264,297 B2 | 9/2012 | Thompson |
| 8,304,666 B2 | 11/2012 | Ko |
| 8,339,232 B2 | 12/2012 | Lotfi |
| 8,441,118 B2 | 5/2013 | Hua |
| 8,508,053 B2* | 8/2013 | Chumakov ............. H01L 24/81 257/778 |
| 8,522,430 B2 | 9/2013 | Kacker |
| 8,542,079 B2 | 9/2013 | Sherrer |
| 8,641,428 B2 | 2/2014 | Light |
| 8,674,872 B2 | 3/2014 | Billaud |
| 8,742,874 B2 | 6/2014 | Sherrer |
| 8,814,601 B1 | 8/2014 | Sherrer |
| 8,866,300 B1 | 10/2014 | Sherrer |
| 8,888,504 B2 | 11/2014 | Pischler |
| 9,000,863 B2 | 4/2015 | Sherrer |
| 9,024,417 B2 | 5/2015 | Rollin et al. |
| 9,165,906 B2* | 10/2015 | Mohammed ........ H01L 25/0652 |
| 9,306,254 B1 | 4/2016 | Hovey |
| 9,312,589 B2 | 4/2016 | Sherrer et al. |
| 9,325,044 B2 | 4/2016 | Reid |
| 9,360,959 B2* | 6/2016 | Perlin ..................... G06F 3/005 |
| 9,505,613 B2 | 11/2016 | Sherrer |
| 9,583,856 B2 | 2/2017 | Sherrer |
| 9,786,975 B2 | 2/2017 | Kocurek |
| 9,633,976 B1 | 4/2017 | Bernstein |
| 9,888,600 B2 | 2/2018 | Hovey |
| 10,002,818 B2 | 6/2018 | Rollin et al. |
| 10,128,601 B1 | 10/2020 | Beroz |
| 2001/0040051 A1 | 11/2001 | Lipponen |
| 2001/0045361 A1 | 11/2001 | Boone |
| 2002/0075104 A1 | 6/2002 | Kwon |
| 2002/0127768 A1 | 9/2002 | Badir |
| 2003/0029729 A1 | 2/2003 | Cheng |
| 2003/0052755 A1 | 3/2003 | Barnes |
| 2003/0117237 A1 | 6/2003 | Niu |
| 2003/0221968 A1 | 12/2003 | Cohen |
| 2003/0222738 A1 | 12/2003 | Brown |
| 2004/0000701 A1 | 1/2004 | White |
| 2004/0004061 A1 | 1/2004 | Merdan |
| 2004/0007468 A1 | 1/2004 | Cohen |
| 2004/0007470 A1 | 1/2004 | Smalley |
| 2004/0038586 A1 | 2/2004 | Hall |
| 2004/0076806 A1 | 4/2004 | Miyanaga |
| 2004/0124961 A1 | 7/2004 | Aoyagi |
| 2004/0196112 A1 | 10/2004 | Welbon |
| 2004/0263290 A1 | 12/2004 | Sherrer |
| 2005/0000561 A1* | 1/2005 | Baret ..................... H01L 31/048 136/244 |
| 2005/0030124 A1 | 2/2005 | Okamoto |
| 2005/0042932 A1 | 2/2005 | Mok |
| 2005/0045484 A1 | 3/2005 | Smalley |
| 2005/0156693 A1 | 7/2005 | Dove |
| 2005/0230145 A1 | 10/2005 | Ishii |
| 2005/0250253 A1 | 11/2005 | Cheung |
| 2007/0158859 A1* | 7/2007 | Hierholzer ............... H01L 24/49 257/784 |
| 2008/0191817 A1 | 8/2008 | Sherrer |
| 2008/0197946 A1 | 8/2008 | Houck |
| 2008/0199656 A1 | 8/2008 | Nichols |
| 2008/0240656 A1 | 10/2008 | Rollin |
| 2009/0004385 A1 | 1/2009 | Blackwell |
| 2009/0051476 A1 | 2/2009 | Tada |
| 2009/0127702 A1* | 5/2009 | Dekker ................. H01L 21/486 257/713 |
| 2009/0154972 A1 | 6/2009 | Tanaka |
| 2010/0007016 A1 | 1/2010 | Oppermann |
| 2010/0015850 A1 | 1/2010 | Stein |
| 2010/0109819 A1 | 5/2010 | Houck |
| 2010/0225435 A1 | 9/2010 | Li |
| 2010/0296252 A1 | 11/2010 | Rollin |

(56) References Cited

U.S. PATENT DOCUMENTS

| | | | |
|---|---|---|---|
| 2010/0323551 | A1 | 12/2010 | Eldridge |
| 2011/0123783 | A1 | 5/2011 | Sherrer |
| 2011/0123794 | A1 | 5/2011 | Hiller |
| 2011/0181376 | A1 | 7/2011 | Vanhille |
| 2011/0181377 | A1 | 7/2011 | Vanhille |
| 2011/0210807 | A1 | 9/2011 | Sherrer |
| 2011/0273241 | A1 | 11/2011 | Sherrer |
| 2012/0233849 | A1 | 9/2012 | Smeys |
| 2013/0050055 | A1 | 2/2013 | Paradiso |
| 2013/0127577 | A1 | 5/2013 | Lotfi |
| 2014/0231815 | A1* | 8/2014 | Railkar .............. H01L 23/3735 257/76 |
| 2016/0054385 | A1 | 2/2016 | Suto |
| 2016/0268967 | A1* | 9/2016 | Webb .................... H01L 35/30 |

FOREIGN PATENT DOCUMENTS

| | | | |
|---|---|---|---|
| EP | 0398019 | A1 | 11/1990 |
| EP | 0485831 | A1 | 5/1992 |
| EP | 0845831 | A2 | 6/1998 |
| EP | 0911903 | A2 | 4/1999 |
| FR | 2086327 | A1 | 12/1971 |
| GB | 2265754 | | 10/1993 |
| JP | H027587 | A | 1/1990 |
| JP | 3027587 | | 2/1991 |
| JP | H041710 | A | 1/1992 |
| JP | H0685510 | A | 3/1994 |
| JP | H06302964 | A | 10/1994 |
| JP | H07060844 | | 3/1995 |
| JP | H07235803 | | 9/1995 |
| JP | H10041710 | | 2/1998 |
| JP | 1998163711 | | 6/1998 |
| JP | 2002533954 | | 10/2002 |
| JP | 2003032007 | | 1/2003 |
| JP | 2003249731 | | 9/2003 |
| JP | 200667621 | | 3/2006 |
| JP | 2007253354 | | 10/2007 |
| JP | 2008211159 | | 9/2008 |
| TW | I244799 | | 12/2005 |
| WO | 0007218 | A2 | 2/2000 |
| WO | 0039854 | A1 | 7/2000 |
| WO | 0206152 | A2 | 1/2002 |
| WO | 02080279 | A1 | 10/2002 |
| WO | 2004004061 | | 1/2004 |
| WO | 2005112105 | | 11/2005 |
| WO | 2009013751 | A2 | 1/2009 |
| WO | 2010111455 | | 9/2010 |
| WO | WO2015/188226 | A1 * | 12/2015 ............. H01L 21/00 |

OTHER PUBLICATIONS

"Shiffman phase shifters designed to work over a 15-45GHz range," phys.org, Mar. 2014. [online: http://phys.org/wire-news/156496085/schiffman-phase-shifters-designed-to-work-over-a-15-45ghz-range.html].

A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.

A. Boryssenko, K. Vanhille, "300-GHz microfabricated waveguide slotted arrays" 2014 IEEE International Conference on Infrared, Millimeter, and Terahertz Waves, Tucson, Sep. 2014.

A.A. Immorlica Jr., R. Actis, D. Nair, K. Vanhille, C. Nichols, J.-M. Rollin, D. Fleming, R. Varghese, D. Sherrer, D. Filipovic, E. Cullens, N. Ehsan, and Z. Popovic, "Miniature 3D micromachined solid state amplifiers," in 2008 IEEE International Conference on Microwaves, Communications, Antennas, and Electronic Systems, Tel-Aviv, Israel, May 2008, pp. 1-7.

Ali Darwish et al.; Vertical Balun and Wilkinson Divider; 2002 IEEE MTT-S Digest; pp. 109-112. NPL_30.

B. Cannon, K. Vanhille, "Microfabricated Dual-Polarized, W-band Antenna Architecture for Scalable Line Array Feed," 2015 IEEE Antenna and Propagation Symposium, Vancouver, Canada, Jul. 2015.

Brown et al., 'A Low-Loss Ka-Band Filter in Rectangular Coax Made by Electrochemical Fabrication', submitted to Microwave and Wireless Components Letters, date unknown {downloaded from www.memgen.com, 2004). NPL_1.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Chwomnawang et al., 'On-chip 3D Air Core Micro-Inductor for High-Frequency Applications Using Deformation of Sacrificial Polymer', Proc. SPIE, vol. 4334, pp. 54-62, Mar. 2001. NPL_2.

Colantonio, P., et al., "High Efficiency RF and Microwave Solid State Power Amplifiers," pp. 380-395, 2009.

Cole, B.E., et al., Micromachined Pixel Arrays Integrated with CMOS for Infrared Applications, pp. 64-64 (2000). NPL_3.

D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.

D. Filipovic, G. Potvin, D. Fontaine, Y. Saito, J.-M. Rollin, Z. Popovic, M. Lukic, K. Vanhille, C. Nichols, "Â?Âµ-coaxial phased arrays for Ka-Band Communications," Antenna Applications Symposium, Monticello, IL, Sep. 2008, pp. 104-115.

D. Filipovic, Z. Popovic, K. Vanhille, M. Lukic, S. Rondineau, M. Buck, G. Potvin, D. Fontaine, C. Nichols, D. Sherrer, S. Zhou, W. Houck, D. Fleming, E. Daniel, W. Wilkins, V. Sokolov, E. Adler, and J. Evans, "Quasi-planar rectangular µ-coaxial structures for mm-wave applications," Proc. GomacTech., pp. 28-31, San Diego, Mar. 2006.

D. Sherrer, "Improving electronics' functional density," MICROmanufacturing, May/Jun. 2015, pp. 16-18.

D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.

De Los Santos, H.J., Introduction to Microelectromechanical (MEM) Microwave Systems {pp. 4, 7-8, 13) (1999). NPL_4.

Derwent Abstract Translation of WO-2010-011911 A2 (published 2010).

Deyong, C, et al., A Microstructure Semiconductor Thermocouple for Microwave Power Sensors, 1997 Asia Pacific Microwave Conference, pp. 917-919. NPL_5.

E. Cullens, "Microfabricated Broadband Components For Microwave Front Ends," Thesis, 2011.

E. Cullens, K. Vanhille, Z. Popovic, "Miniature bias-tee networks integrated in microcoaxial lines," in Proc. 40th European Microwave Conf., Paris, France, Sep. 2010, pp. 413-416.

E. Cullens, L. Ranzani, E. Grossman, Z. Popovic, "G-Band Frequency Steering Antenna Array Design and Measurements," Proceedings of the XXXth URSI General Assembly, Istanbul, Turkey, Aug. 2011.

E. Cullens, L. Ranzani, K. Vanhille, E. Grossman, N. Ehsan, Z. Popovic, "Micro-Fabricated 130-180 GHz frequency scanning waveguide arrays," IEEE Trans. Antennas Propag., Aug. 2012, vol. 60, No. 8, pp. 3647-3653.

Ehsan, N. et al., "Microcoaxial lines for active hybrid-monolithic circuits," 2009 IEEE MTT-S Int. Microwave.Symp. Boston, MA, Jun. 2009.

Ehsan, N., "Broadband Microwave Litographic 3D Components," Doctoral Dissertation 2010.

Elliott Brown/MEMGen Corporation, 'RF Applications of EFAB Technology', MTT-S IMS 2003, pp. 1-15. NPL_6.

Engelmann et al., 'Fabrication of High Depth-to-Width Aspect Ratio Microstructures', IEEE Micro Electro Mechanical Systems (Feb. 1992), pp. 93-98.

European Examination Report dated Mar. 21, 2013 for EP Application No. 07150463.3.

(56) References Cited

OTHER PUBLICATIONS

European Examination Report of corresponding European Patent Application No. 08 15 3144 dated Apr. 6, 2010.
European Examination Report of corresponding European Patent Application No. 08 15 3144 dated Feb. 22, 2012.
European Examination Report of corresponding European Patent Application No. 08 15 3144 dated Nov. 10, 2008.
European Examination Report of EP App. No. 07150463.3 dated Feb. 16, 2015.
European Search Report for corresponding EP Application No. 07150463.3 dated Apr. 23, 2012.
European Search Report of corresponding European Application No. 08 15 3138 dated Jul. 15, 2008.
European Search Report of Corresponding European Application No. 07 15 0467 dated Apr. 28, 2008.
European Search Report of corresponding European Patent Application No. 08 15 3144 dated Jul. 2, 2008.
Extended EP Search Report for EP Application No. 12811132.5 dated Feb. 5, 2016.
Filipovic et al.; 'Modeling, Design, Fabrication, and Performance of Rectangular .mu.-Coaxial Lines and Components'; Microwave Symposium Digest, 2006, IEEE; Jun. 1, 2006; pp. 1393-1396.
Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.
Filipovic, D.S., "Design of microfabricated rectangular coaxial lines and components for mm-wave applications," Microwave Review, vol. 12, No. 2, Nov. 2006, pp. 11-16.
Franssila, S., Introduction to Microfabrication, (pp. 8) (2004). NPL_7.
Frazier et al., 'M ET ALlic Microstructures Fabricated Using Photosensitive Polyimide Electroplating Molds', Journal of Microelectromechanical Systems, vol. 2, No. 2, Jun. 1993, pp. 87-94. NPL_8.
Ghodisian, B., et al., Fabrication of Affordable M ET ALlic Microstructures by Electroplating and Photoresist Molds, 1996, pp. 68-71. NPL_9.
H. Guckel, 'High-Aspect-Ratio Micromachining Via Deep X-Ray Lithography', Proc. Of IEEE, vol. 86, No. 8 (Aug. 1998), pp. 1586-1593. NPL_10.
H. Kazemi, "350mW G-band Medium Power Amplifier Fabricated Through a New Method of 3D-Copper Additive Manufacturing," IEEE 2015.
H. Kazemi, "Ultra-compact G-band 16way Power Splitter/Combiner Module Fabricated Through a New Method of 3D-Copper Additive Manufacturing," IEEE 2015.
H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.
H. Zhou, N. A. Sutton, D. S. Filipovic, "Wideband W-band patch antenna," 5th European Conference on Antennas and Propagation , Rome, Italy, Apr. 2011, pp. 1518-1521.
H. Zhou, N.A. Sutton, D. S. Filipovic, "W-band endfire log periodic dipole array," Proc. IEEE-APS/URSI Symposium, Spokane, WA, Jul. 2011, pp. 1233-1236.
Hawkins, C.F., The Microelectronics Failure Analysis, Desk Reference Edition (2004). NPL_11.
Horton, M.C., et al., "The Digital Elliptic Filter-A Compact Sharp-Cutoff Design for Wide Bandstop or Bandpass Requirements," IEEE Transactions on Microwave Theory and Techniques, (1967) MTT-15:307-314.
Immorlica, Jr., T. et al., "Miniature 3D micro-machined solid state power amplifiers," COMCAS 2008.
Ingram, D.L. et al., "A 427 mW 20% compact W-band InP HEMT MMIC power amplifier," IEEE RFIC Symp. Digest 1999, pp. 95-98.
International Preliminary Report on Patentability dated Jul. 24, 2012 for corresponding PCT/US2011/022173.
International Preliminary Report on Patentability dated May 19, 2006 on corresponding PCT/US04/06665.
International Search Report and Written Opinion for PCT/US2015/011789 dated Apr. 10, 2015.
International Search Report and Written Opinion for PCT/US2015/063192 dated May 20, 2016.
International Search Report corresponding to PCT/US12/46734 dated Nov. 20, 2012.
International Search Report dated Aug. 29, 2005 on corresponding PCT/US04/06665.
J. M. Oliver, J.-M. Rollin, K. Vanhille, S. Raman, "A W-band micromachined 3-D cavity-backed patch antenna array with integrated diode detector," IEEE Trans. Microwave Theory Tech., Feb. 2012, vol. 60, No. 2, pp. 284-292.
J. M. Oliver, P. E. Ralston, E. Cullens, L. M. Ranzani, S. Raman, K. Vanhille, "A W-band Micro-coaxial Passive Monopulse Comparator Network with Integrated Cavity—Backed Patch Antenna Array," 2011 IEEE MTT-S Int. Microwave, Symp., Baltimore, MD, Jun. 2011.
J. Mruk, "Wideband Monolithically Integrated Front-End Subsystems and Components," Thesis, 2011.
J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.
J. Oliver, "3D Micromachined Passive Components and Active Circuit Integration for Millimeter-Wave Radar Applications," Thesis, Feb. 10, 2011.
J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves , Sep. 2010, pp. 1-2.
J. R. Mruk, N. Sutton, D. S. Filipovic, "Micro-coaxial fed 18 to 110 GHz planar log-periodic antennas with RF transitions," IEEE Trans. Antennas Propag., vol. 62, No. 2, Feb. 2014, pp. 968-972.
J. Reid, "PolyStrata Millimeter-wave Tunable Filters," GOMACTech-12, Mar. 22, 2012.
J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, WA, Jun. 2013.
J.R. Mruk, Y. Saito, K. Kim, M. Radway, D. Filipovic, "A directly fed Ku- to W-band 2-arm Archimedean spiral antenna," Proc. 41st European Microwave Conf., Oct. 2011, pp. 539-542.
J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.
J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.
Jeong, I., et al., "High Performance Air-Gap Transmission Lines and Inductors for Milimeter-Wave Applications", Transactions on Microwave Theory and Techniques, vol. 50, No. 12, Dec. 2002.
Jeong, Inho et al., 'High-Performance Air-Gap Transmission Lines and Inductors for Millimeter-Wave Applications', IEEE Transactions on Microwave Theory and Techniques, Dec. 2002, pp. 2850-2855, vol. 50, No. 12. NPL_12.
K. J. Vanhille, D. L. Fontaine, C. Nichols, D. S. Filipovic, and Z. Popovic, "Quasi-planar high-Q millimeter-wave resonators," IEEE Trans. Microwave Theory Tech., vol. 54, No. 6, pp. 2439-2446, Jun. 2006.
K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.
K. Vanhille, "Design and Characterization of Microfabricated Three-Dimensional Millimeter-Wave Components," Thesis, 2007.
K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.

(56) References Cited

OTHER PUBLICATIONS

K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.

K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.

Katehi et al., 'MEMS and Si Micromachined Circuits for High-Frequency Applications', IEEE Transactions on Microwave Theory and Techniques, vol. 50, No. 3, Mar. 2002, pp. 858-866. NPL_13.

Kenneth J. Vanhille et al.; Micro-Coaxial Imedance Transformers; Journal of Latex Class Files; vol. 6; No. 1; Jan. 2007. NPL_29.

Kwok, P.Y., et al., Fluid Effects in Vibrating Micromachined Structures, Journal of Microelectromechanical Systems, vol. 14, No. 4, Aug. 2005, pp. 770-781. NPL_14.

L. Ranzani, D. Kuester, K. J. Vanhille, A Boryssenko, E. Grossman, Z. Popovic, "G-Band micro-fabricated frequency-steered arrays with 2Ã?Åo/GHz beam steering," IEEE Trans. on Terahertz Science and Technology, vol. 3, No. 5, Sep. 2013.

L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.

L. Ranzani, I. Ramos, Z. Popovic, D. Maksimovic, "Microfabricated transmission-line transformers with DC isolation," URSI National Radio Science Meeting, Boulder, CO, Jan. 2014.

L. Ranzani, N. Ehsan, Z. Popovic, "G-band frequency-scanned antenna arrays," 2010 IEEE APS-URSI International Symposium, Toronto, Canada, Jul. 2010.

Lee et al., 'Micromachining Applications of a High Resolution Ultrathick Photoresist', J. Vac. Sci. Technol. B 13 (6), Nov./Dec. 1995, pp. 3012-3016. NPL_15.

Loechel et al., 'Application of Ultraviolet Depth Lithography for Surface Micromachining', J. Vac. Sci. Technol. B 13 (6), Nov./Dec. 1995, pp. 2934-2939. NPL_16.

Lukic, M. et al., "Surface-micromachined dual Ka-band cavity backed patch antennas," IEEE Trans. AtennasPropag., vol. 55, pp. 2107-2110, Jul. 2007.

M. Lukic, D. Filipovic, "Modeling of surface roughness effects on the performance of rectangular Ã?Åμ-coaxial lines," Proc. 22nd Ann. Rev. Prog. Applied Comp. Electromag. (ACES), pp. 620-625, Miami, Mar. 2006.

M. Lukic, D. Fontaine, C. Nichols, D. Filipovic, "Surface micromachined Ka-band phased array antenna," Presented at Antenna Applic. Symposium, Monticello, IL, Sep. 2006.

M. Lukic, K. Kim, Y. Lee, Y. Saito, and D. S. Filipovic, "Multiphysics design and performance of a surface micromachined Ka-band cavity backed patch antenna," 2007 SBMO/IEEE Int. Microwave and Optoelectronics Conf., Oct. 2007, pp. 321-324.

M. Lukic, S. Rondineau, Z. Popovic, D. Filipovic, "Modeling of realistic rectangular Ã?Åμ-coaxial lines," IEEE Trans. Microwave Theory Tech., vol. 54, No. 5, pp. 2068-2076, May 2006.

M. V. Lukic, and D. S. Filipovic, "Integrated cavity-backed ka-band phased array antenna," Proc. IEEE-APS/URSI Symposium, Jun. 2007, pp. 133-135.

M. V. Lukic, and D. S. Filipovic, "Modeling of 3-D Surface Roughness Effects With Application to Ã?Åμ-Coaxial Lines," IEEE Trans. Microwave Theory Tech., Mar. 2007, pp. 518-525.

M. V. Lukic, and D. S. Filipovic, "Surface-micromachined dual Ka-and cavity backed patch antenna," IEEE Trans. Antennas Propag., vol. 55, No. 7, pp. 2107-2110, Jul. 2007.

Madou, M.J., Fundamentals of Microfabrication: The Science of Miniaturization, 2d Ed., 2002 (Roadmap; pp. 615-668). NPL_17.

Mruk, J.R., Filipovic, D.S, "Micro-coaxial V-/W-band filters and contiguous diplexers," Microwaves, Antennas & Propagation, IET, Jul. 17, 2012, vol. 6, issue 10, pp. 1142-1148.

Mruk, J.R., Saito, Y., Kim, K., Radway, M., Filipovic, D.S., "Directly fed millimetre-wave two-arm spiral antenna," Electronics Letters, Nov. 25, 2010, vol. 46 , issue 24, pp. 1585-1587.

N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.

N. Ehsan, "Broadband Microwave Lithographic 3D Components," Thesis, 2009.

N. Ehsan, K. Vanhille, S. Rondineau, E. Cullens, Z. Popovic, "Broadband Wilkinson Dividers," IEEE Trans. Microwave Theory Tech., Nov. 2009, pp. 2783-2789.

N. Ehsan, K.J. Vanhille, S. Rondineau, Z. Popovic, "Micro-coaxial impedance transformers," IEEE Trans. Microwave Theory Tech., Nov. 2010, pp. 2908-2914.

N. Jastram, "Design of a Wideband Millimeter Wave Micromachined Rotman Lens," IEEE Transactions On Antennas And Propagation, vol. 63, No. 6, Jun. 2015.

N. Jastram, "Wideband Millimeter-Wave Surface Micromachined Tapered Slot Antenna," IEEE Antennas And Wireless Propagation Letters, vol. 13, 2014.

N. Jastram, "Wideband Multibeam Millimeter Wave Arrays," IEEE 2014.

N. Jastram, D. Filipovic, "Monolithically integrated K/Ka array-based direction finding subsystem," Proc. IEEE-APS/URSI Symposium, Chicago, IL, Jul. 2012, pp. 1-2.

N. Jastram, D. S. Filipovic, "Parameter study and design of W-band micromachined tapered slot antenna," Proc. IEEE-APS/URSI Symposium, Orlando, FL, Jul. 2013, pp. 434-435.

N. Jastram, D. S. Filipovic, "PCB-based prototyping of 3-D micromachined RF subsystems," IEEE Trans. Antennas Propag., vol. 62, No. 1, Jan. 2014. pp. 420-429.

N. Sutton, D.S. Filipovic, "Design of a K- thru Ka-band modified Butler matrix feed for a 4-arm spiral antenna," 2010 Loughborough Antennas and Propagation Conference, Loughborough, UK, Nov. 2010, pp. 521-524.

N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.

N.A. Sutton, J. M. Oliver, D. S. Filipovic, "Wideband 15-50 GHz symmetric multi-section coupled line quadrature hybrid based on surface micromachining technology," 2012 IEEE MTT-S Int. Microwave, Symp., Montreal, Canada, Jun. 2012.

N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.

Oliver, J.M. et al., "A 3-D micromachined W-band cavity backed patch antenna array with integrated rectacoax transition to wave guide," 2009 Proc. IEEE International Microwave Symposium, Boston, MA 2009.

P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.

P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.

P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.

Park et al., 'Electroplated Micro-Inductors and Micro-Transformers for Wireless application', IMAPS 2002, Denver, CO, Sep. 2002. NPL_18.

PwrSoC Update 2012: Technology, Challenges, and Opportunities for Power Supply on Chip, Presentation (Mar. 18, 2013).

Rollin, J.M. et al., "A membrane planar diode for 200GHz mixing applications," 29th International Conference on Infrared and Millimeter Waves and Terahertz Electronics, pp. 205-206, Karlsrube, 2004.

(56) References Cited

OTHER PUBLICATIONS

Rollin, J.M. et al., "Integrated Schottky diode for a sub-harmonic mixer at millimetre wavelengths," 31st International Conference on Infrared and Millimeter Waves and Terahertz Electronics, Paris, 2006.
S. Huettner, "High Performance 3D Micro-Coax Technology," Microwave Journal, Nov. 2013. [online: http://www.microwavejournal.com/articles/21004-high-performance-3d-micro-coax-technology].
S. Huettner, "Transmission lines withstand vibration," Microwaves and RF, Mar. 2011. [online: http://mwrf.com/passive-components/transmission-lines-withstand-vibration].
S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.
S. Scholl, C. Gorle, F. Houshmand, T. Verstraete, M. Asheghi, K. Goodson, "Optimization of a microchannel geometry for cooling high heat flux microelectronics using numerical methods," InterPACK, San Francisco, CA, Jul. 2015.
Saito et al., "Analysis and design of monolithic rectangular coaxial lines for minimum coupling," IEEE Trans. Microwave Theory Tech., vol. 55, pp. 2521-2530, Dec. 2007.
Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.
Sedky, S., Post-Processing Techniques for Integrated MEMS (pp. 9, 11, 164) (2006). NPL_19.
Sherrer, D, Vanhille, K, Rollin, J.M., 'PolyStrata Technology: A Disruptive Approach for 3D Microwave Components and Modules,' Presentation (Apr. 23, 2010).
T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].
T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.
T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN-SiC Chip," InterPACK/ICNMM, San Francisco, CA, Jul. 2015.
T.E. Durham, "An 8-40GHz Wideband Instrument for Snow Measurements," Earth Science Technology Forum, Pasadena, CA, Jun. 2011.
Tian, et al.; Fabrication of multilayered SU8 structure for terahertz waveguide with ultralow transmission loss; Aug. 18, 2013; Dec. 10, 2013; pp. 13002-1 to 13002-6.
Tummala et al.; 'Microelectronics Packaging Handbook'; Jan. 1, 1989; XP002477031; pp. 710-714. NPL_31.
Vanhille, K. et al., 'Balanced low-loss Ka-band -coaxial hybrids,' IEEE MTT-S Dig., Honolulu, Hawaii, Jun. 2007.
Vanhille, K. et al., "Ka-Band surface mount directional coupler fabricated using micro-rectangular coaxial transmission lines," 2008 Proc. IEEE International Microwave Symposium, 2008.
Vanhille, K., 'Design and Characterization of Microfabricated Three-Dimensional Millimeter-Wave Components,' Dissertation, 2007.
Vanhille, K.J. et al., "Ka-band miniaturized quasi-planar high-Q resonators," IEEE Trans. Microwave Theory Tech., vol. 55, No. 6, pp. 1272-1279, Jun. 2007.
Vyas R. et al., "Liquid Crystal Polymer (LCP): The ultimate solution for low-cost RF flexible electronics and antennas," Antennas and Propagation Society, International Symposium, p. 1729-1732 (2007).
Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.
Wang, H. et al., "Power-amplifier modules covering 70-113 GHz using MMICs," IEEE Trans Microwave Theory and Tech., vol. 39, pp. 9-16, Jan. 2001.
Written Opinion corresponding to PCT/US12/46734 dated Nov. 20, 2012.
Written Opinion of the International Searching Authority dated Aug. 29, 2005 on corresponding PCT/US04/06665.
Y. Saito, D. Fontaine, J.-M. Rollin, D.S. Filipovic, "Monolithic micro-coaxial power dividers," Electronic Letts., Apr. 2009, pp. 469-470.
Y. Saito, J.R. Mruk, J.-M. Rollin, D.S. Filipovic, "X- through Q-band log-periodic antenna with monolithically integrated u-coaxial impedance transformer/feeder," Electronic Letts. Jul. 2009, pp. 775-776.
Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.
Yeh, J.L., et al., Copper-Encapsulated Silicon Micromachined Structures, Journal of Microelectromechanical Systems, vol. 9, No. 3, Sep. 2000, pp. 281-287. NPL_20.
Yoon et al., '3-D Lithography and M ET AL Surface Micromachining for RF and Microwave MEMs' IEEE MEMS 2002 Conference, Las Vegas, NV, Jan. 2002, pp. 673-676. NPL_21.
Yoon et al., 'CMOS-Compatible Surface Micromachined Suspended-Spiral Inductors for Multi-GHz Sillicon RF Ics', IEEE Electron Device Letters, vol. 23, No. 10, Oct. 2002, pp. 591-593. NPL_22.
Yoon et al., 'High-Performance Electroplated Solenoid-Type Integrated Inductor (SI2) for RF Applications Using Simple 3D Surface Micromachining Technology', Int'l Election Devices Meeting, 1998, San Francisco, CA, Dec. 6-9, 1998, pp. 544-547. NPL_23.
Yoon et al., 'High-Performance Three-Dimensional On-Chip Inductors Fabricated by Novel Micromachining Technology for RF MMIC', 1999 IEEE MTT-S Int'l Microwave Symposium Digest, vol. 4, Jun. 13-19, 1999, Anaheim, California, pp. 1523-1526. NPL_24.
Yoon et al., 'Monolithic High-Q Overhang Inductors Fabricated on Silicon and Glass Substrates', International Electron Devices Meeting, Washington D.C. (Dec. 1999), pp. 753-756. NPL_25.
Yoon et al., 'Monolithic Integration of 3-D Electroplated Microstructures with Unlimited Number of Levels Using Planarization with a Sacrificial M ET ALlic Mole (PSMm)', Twelfth IEEE Int'l Conf. on Micro Electro mechanical systems, Orlando Florida, Jan. 1999, pp. 624-629. NPL_26.
Yoon et al., 'Multilevel Microstructure Fabrication Using Single-Step 3D Photolithography and Single-Step Electroplating', Proc. Of SPIE, vol. 3512, (Sep. 1998), pp. 358-366. NPL_27.
Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.
Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).
Z. Popovic, K. Vanhille, N. Ehsan, E. Cullens, Y. Saito, J.-M. Rollin, C. Nichols, D. Sherrer, D. Fontaine, D. Filipovic, "Micro-fabricated micro-coaxial millimeter-wave components," in 2008 Int. Conf. on Infrared, Millimeter and Terahertz Waves, Pasadena, CA, Sep. 2008, pp. 1-3.
Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.
Complaint in the General Court of Justice Superior Court Division State of North Carolina, County of Wake; *Masud Beroz and Componentzee, LLCV. Nuvotronics, Inc.*; Nov. 16, 2017.
Answer and Counter Claim in the General Court of Justice Superior Court Division State of North Carolina, County of Wake; *Masud Beroz and Componentzee, LLCV. Nuvotronics, Inc.*; Jan. 18, 2018.
Assignments of U.S. Appl. No.62/327,807. Apr. 26, 2016.
Preliminary Amendment, Office Action, Response to Office Action and Notice of Allowance in U.S. Appl. No. 15/895,794. dated Mar. 22, 2018, Feb. 14, 2018.

(56) References Cited

OTHER PUBLICATIONS

USDC Eastern District of North Carolina Western Division; *Nuvotronics, Inc. v. Componentzee LLC et al.*; Civil Action; Case No. 5:19-cv-00072; Feb. 28, 2019; pp. 1-16.

USDC Eastern District of North Carolina Western Division; *Nuvotronics, Inc. v. Componentzee LLC et al.*; Defendants' Motion to Dismiss; Case 5:19-cv-00072-FL; Apr. 26, 2019; pp. 1-3.

USDC Eastern District of North Carolina Western Division; Memorandum of Law in Support of Defendants' Motion to Dismiss; *Nuvotronics, Inc. v. Componentzee LLC et al.*; Case 5:19;v-00072-FL; Apr. 26, 2019; pp. 1-15.

USDC Eastern District of North Carolina Western Division; Plaintiff'S Response to Defendants' Motion to Dismiss; *Nuvotronics, Inc. v. Componentzee* LLC et al.; Case 5:19-cv-00072-FL; May 31, 2019; pp. 1-17.

USDC Eastern District of North Carolina Western Division; Defendants' Reply to Plaintiff'S Response to Defendants' Motion to *Dismisscomponentzee LLC et al.v. Componentzee LLC et al.*; case 5:19-cv-00072-FL; Jun. 14, 2019; pp. 1-7.

N.C. Business Court; *Masud Beroz et al.v. Componentzee LLC et al.*; Verified Complaint; Civil Action; Nov. 16, 2017; pp. 1-68.

N.C. Business Court; *Masud Beroz et al.v. Componentzee LLC et al.*; Amended Answer & COUNTERCLAIM; Case No2017CVS13984 ECF No. 57; Apr. 22, 2019; Pgs. 1-53.

N.C. Business Court; *Masud Beroz et al.v. Componentzee LLC et al.*; Reply Brief in Support of Defendant'S Motion to Dismiss Plaintiffs' Fifth Claim for Relief; Case No. 2017CVS13984 ECF No. 26; Feb. 20, 2018; pp. 1-53.

N.C. Business Court; *Masud Beroz et al.v. Componentzee LLC et al.*; Defendant'S Response Brief in opposition to Plaintiffs' Motion to Dismiss Nuvotronics' Counterclaims; Case No.2017CVS13984 ECF No. 29; Mar. 12, 2018; pp. 1-13.

N.C. Business Court; *Masud Beroz et al.v. Componentzee LLC et al.*; Answer and Counterclaim; Case No.2017CVS13984 ECF No. 14; Jan. 18, 2018; pp. 1-34.

N.C. Business Court; *Masud Beroz et al.v. Componentzee LLC et al.*; Memorandum in Support of Plaintiffs/Counterclaim Defendants' Motion to Dismiss Counterclaim; Case No.2017CVS13984 ECF No. 24; Feb. 19, 2018.

N.C. Business Court; *Masud Beroz et al.v. Componentzee LLC et al.*; Reply in Support of plaintiffs/Counterclaim Defendants' Motion to Dismiss Counterclaim; Case No.2017CVS13984 ECF No. 32; Mar. 22, 2018; pp. 1-13.

N.C. Business Court; *Masud Beroz et al.v. Componentzee LLC et al.*; Plaintiffs'/Counterclaim. Defendants' Reply to Counterclaim of Defendant/Counterclaim Plaintiff Nuvotronics, Inc.; Case No. 2017CVS13984 ECF No. 25; Feb. 19, 2018; pp. 1-13.

N.C. Business Court; *Masud Beroz et al.v. Componentzee LLC et al.*; Response in Opposition to Defendant/Counterclaim Plaintff'S Motion to Dismiss Plaintiffs' Fifth Claim for Relief; Case No.2017CVS13984 ECF No. 21; Feb. 12, 2018; pp. 1-10.

N.C. Business Court; *Masud Beroz et al.v. Componentzee LLC et al.*; Memorandum of Law in Support.Df Defendants Motion to Dismiss Plaintiff'S Fifth Claim for Relief; Case No. 2017CVS13984 ECF Vo. 13; Jan. 18, 2018; pp. 1-9.

N.C. Business Court; *Masud Beroz et al.v. Componentzee LLC et al.*; Memorandum of Law in Support Df Defendants Motion to Dismiss; Case No.2017CVS13984 ECF No. 60; May 28, 2019; pp. 1-24.

N.C. Business Court; *Masud Beroz et al.v. Componentzee LLC et al.*; Answer to Defendants Counterclaim; Case No.2017CVS13984 ECF No. 58; May 7, 2019; pp. 1-13.

N.C. Business Court; *Masud Beroz et al.v. Componentzee LLC et al.*; Verified Amended Complaint; 2, case No.2017CVS13984 ECF No. 56; Apr. 8, 2019; pp. 1-31.

* cited by examiner

CTE COMPENSATION FOR WAFER-LEVEL AND CHIP-SCALE PACKAGES AND ASSEMBLIES

RELATED APPLICATIONS

This application is a continuation in part of U.S. application Ser. No. 15/498,188, filed on Apr. 27, 2017, the entire contents of which application are incorporated herein by reference.

FIELD OF THE INVENTION

The present invention relates generally to the field of microelectronics, and more particularly to methods for compensating for differences in the coefficient of thermal expansion ("CTE") in different materials used in wafer-level and chip scale packaging of semiconductor devices, especially high frequency (RF) semiconductor devices.

BACKGROUND OF THE INVENTION

Regardless of the method used to realize semiconductor devices such as those disclosed herein, CTE mismatch between the semiconductor substrate and passive materials, such as dielectrics and metals, is a major issue. Traditional or current approaches to integrate antennas directly with microchips involve planar circuits, multi-layer glass stacks, BCB, polyimide or other technologies either bonded to or directly integrated on the semiconductor substrate. These options may create their own CTE challenges.

In cases where dissimilar microelectronic substrates are to be joined together at large die format or wafer-to-wafer level format, the CTE mismatch between adjacent substrates can render this effort either impossible or create significant additional cost due to part damage or failure including substrate deformation. Similarly, for a sequential build of metallic circuitry on a low CTE semiconductor wafer or substrate, such as a PolyStrata® coaxial transmission line build, this CTE mismatch is problematic.

SUMMARY OF THE INVENTION

In one of its aspects the present invention relates to methods and structures to allow cost effective wafer level packaging of semiconductor die to turn the structures into chip scale packages at the wafer level. In addition, the present invention can address the CTE mismatch problem that occurs in applications ranging from wafer level packaging for memory or other chips, to antenna circuitry made in a primarily copper PolyStrata® process that is formed on, or attached to, semiconductors, such as to SiGe circuits on silicon substrates, at scales normally not possible due to the CTE mismatch between these two relatively rigid formations. (Examples of PolyStrata® processing/technology are illustrated in U.S. Pat. Nos. 7,948,335, 7,405,638, 7,148, 772, 7,012,489, 7,649,432, 7,656,256, 7,755,174, 7,898,356 and/or U.S. Application Pub. Nos. 2010/0109819, 2011/0210807, 2010/0296252, 2011/0273241, 2011/0123783, 2011/0181376, 2011/0181377, each of which is incorporated herein by reference in their entirety, hereinafter the "incorporated PolyStrata® art"). This may be achieved by applying flexible CTE compensating regions between unit cells into the primarily copper formations to reduce the propagation of stress across large CTE mismatched areas of two or more bonded regions. This approach may work independent of the structures being formed separately and joined, or formed one upon the other. A three-dimensional copper spring structure is envisaged by using PolyStrata® fabrication technology and other manufacturing techniques.

In another of its aspects, the present invention may provide an microelectronic structure having CTE compensation for use in wafer-level and chip-scale packages. The microelectronic structure may include a plurality of substrate tiles each having a generally planar upper surface, the upper surfaces of the tiles disposed within a common plane to provide a generally planar grid of the tiles. Each respective pair of adjacent tiles may have a gap disposed therebetween and a spring structure spanning the gap and connecting the adjacent tiles. The spring structure may be configured to permit movement of the adjacent tiles relative to one another to provide compensation for thermal expansion or contraction of the tiles. The substrate tiles may comprise a semiconductor material and/or metal. The spring structure may comprise metal, and may be provided in the form of a membrane and/or a 2-dimensional serpentine structure. In one particular configuration, the spring structure may be a u-shaped membrane having a longitudinal axis that is disposed parallel to an edge of the upper surface of the selected tile to which the u-shaped membrane is attached. In addition, a dielectric material may be disposed on the common plane and within the gap. A device layer may be attached to the common plane, and the layer may include one or more of resistors, capacitors, inductors, and three-dimensional metal/dielectric structures. The three-dimensional metal/dielectric structures may include one or more of coaxial waveguides, antennas, Wilkinson combiner/dividers, Gysel combiner/dividers, and filters. The plurality of tiles may each comprise multiple layers of metal disposed parallel to the upper surface, which may result from formation using a multilayer build process, such as the PolyStrata® process. Microelectronic structures of the present invention may include antenna arrays having a plurality of antenna radiator structures disposed above the upper surfaces of the tiles.

In yet another of its aspects, the present invention may provide a method of forming a three-dimensional microstructure by a sequential build process, comprising disposing a plurality of layers over a substrate, wherein the layers comprise one or more layers of a conductive material and one or more layers of a sacrificial material, thereby forming a structure above the substrate. The structure may include a plurality of conductive tiles formed of the conductive material, each tile having a generally planar upper surface, the upper surfaces of the tiles disposed within a common plane to provide a generally planar grid of the tiles, each respective pair of adjacent tiles having a gap disposed therebetween and a spring structure spanning the gap and connecting the adjacent tiles. The spring structure may be configured to permit movement of the adjacent tiles relative to one another to provide compensation for thermal expansion or contraction of the tiles. In addition the method may include removing the sacrificial material and/or the substrate. The step of disposing a plurality of layers over a substrate may include disposing one or more layers of a dielectric material. In addition, the method may include electrically connecting a device layer to the common plane. The device layer may comprise one or more of resistors, capacitors, inductors, and three-dimensional metal/dielectric structures, such as coaxial waveguides, antennas, Wilkinson combiner/dividers, Gysel combiner/dividers, and filters.

In still a further of its aspects, the present invention may provide a method of forming a three-dimensional microstructure by a sequential build process, such as the Poly- Strata® process. The method may include providing a substrate having opposing upper and lower surfaces, with a trench extending from the lower surface to a region proximate the upper surface; providing a stretcher layer on the trench and lower surface of the substrate; expanding the stretcher layer linearly along a direction parallel to the lower surface of the substrate to separate the substrate into first and second substrate portions divided at the location of the trench providing an expanded trench region; and providing a dielectric material in the expanded trench region. The step of providing a dielectric material may include providing the dielectric material on the upper surface of the first and second substrate portions. A plurality of conductive vias may be provided through the dielectric material, and the vias may be in electrical communication with the upper surface of at least one of the first and second substrate portions. A device layer may be provided over the dielectric material, the device layer including at least one electronic component in electrical communication with a selected one of the vias.

BRIEF DESCRIPTION OF THE DRAWINGS

The foregoing summary and the following detailed description of exemplary embodiments of the present invention may be further understood when read in conjunction with the appended drawings, in which.

DETAILED DESCRIPTION OF THE INVENTION

Figure 1:
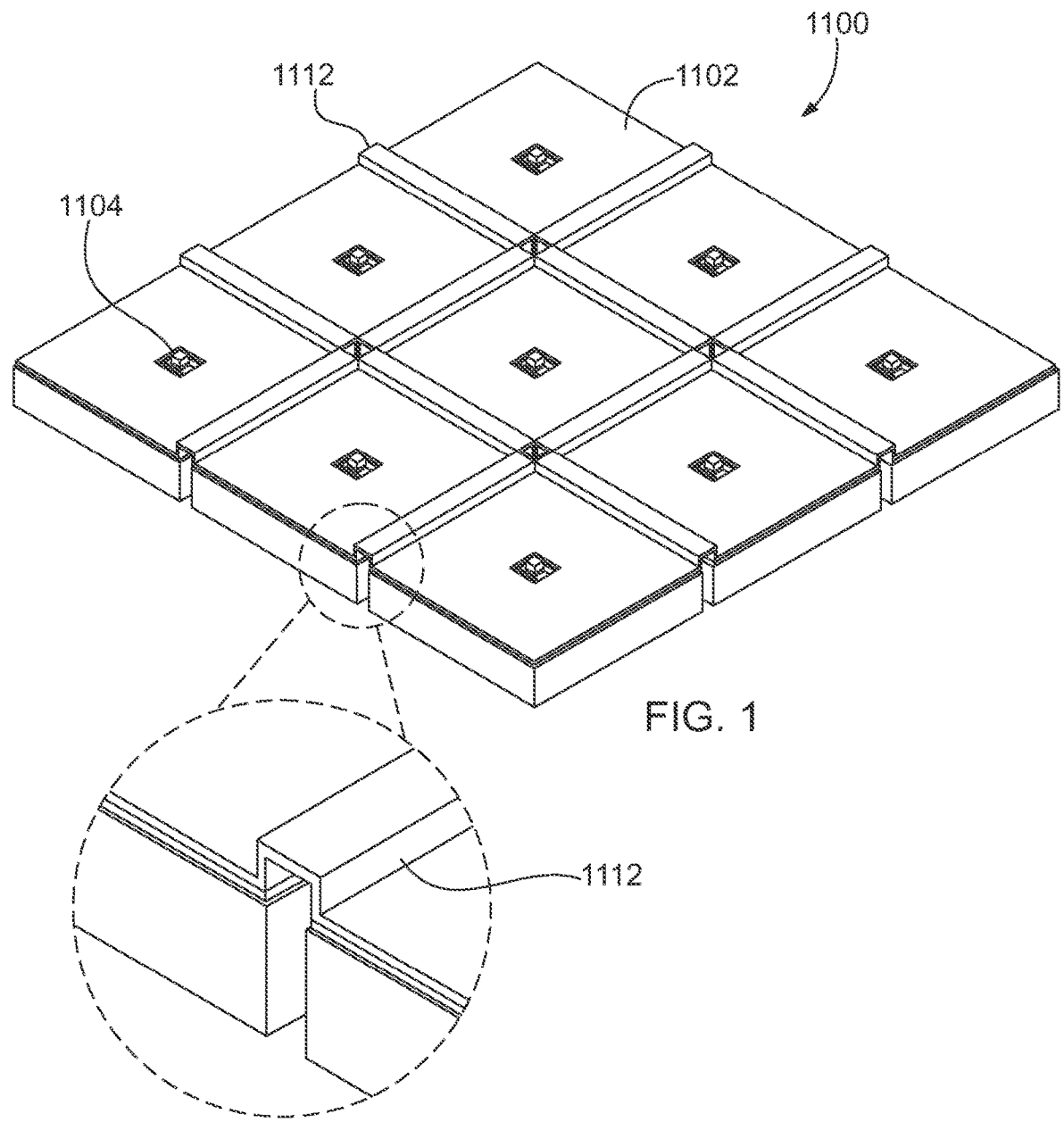
FIG. 1 schematically illustrates a simplified top-isometric view of a three-by-three array of ground plane tiles connected by U-shaped spring features and a detailed view of the U-shaped spring structures in accordance with the present invention.
Figure 2:
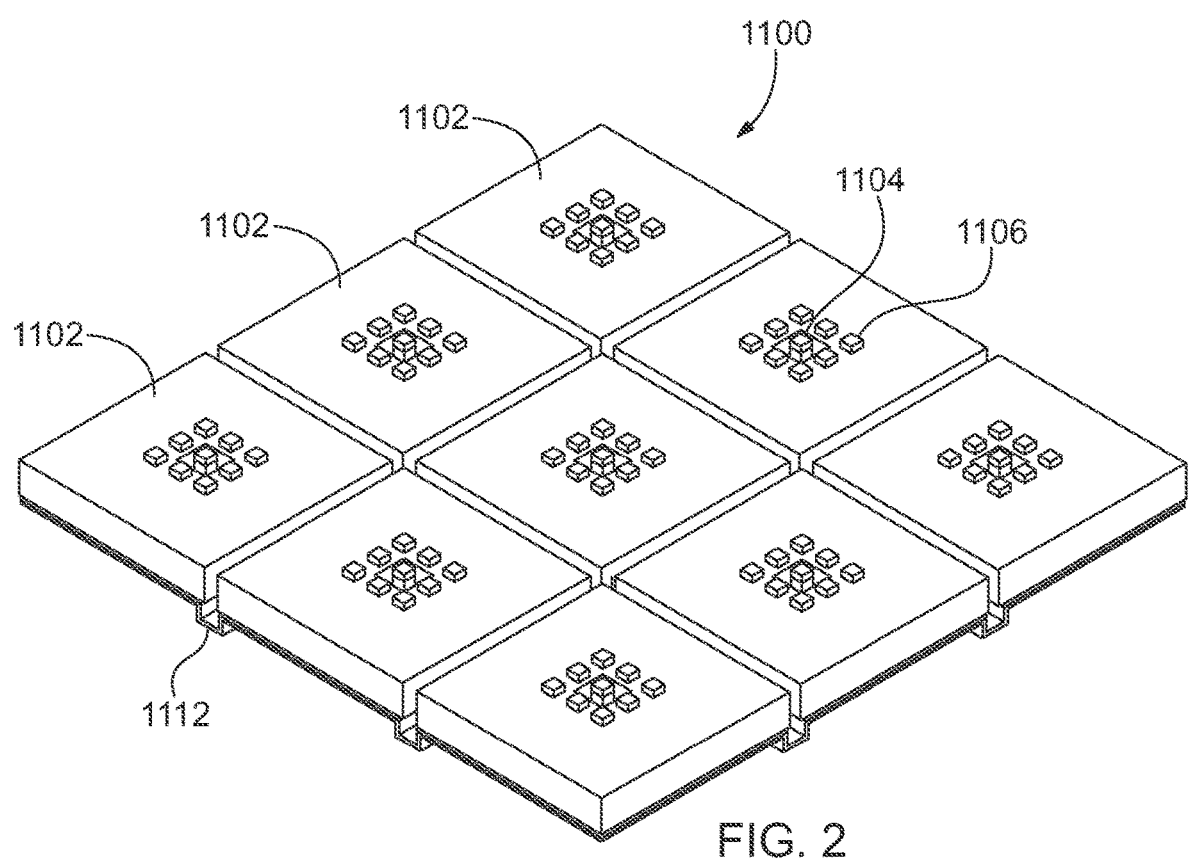
FIG. 2 schematically illustrates a bottom isometric view of the array of ground plane tiles of FIG. 1.
Figure 3:
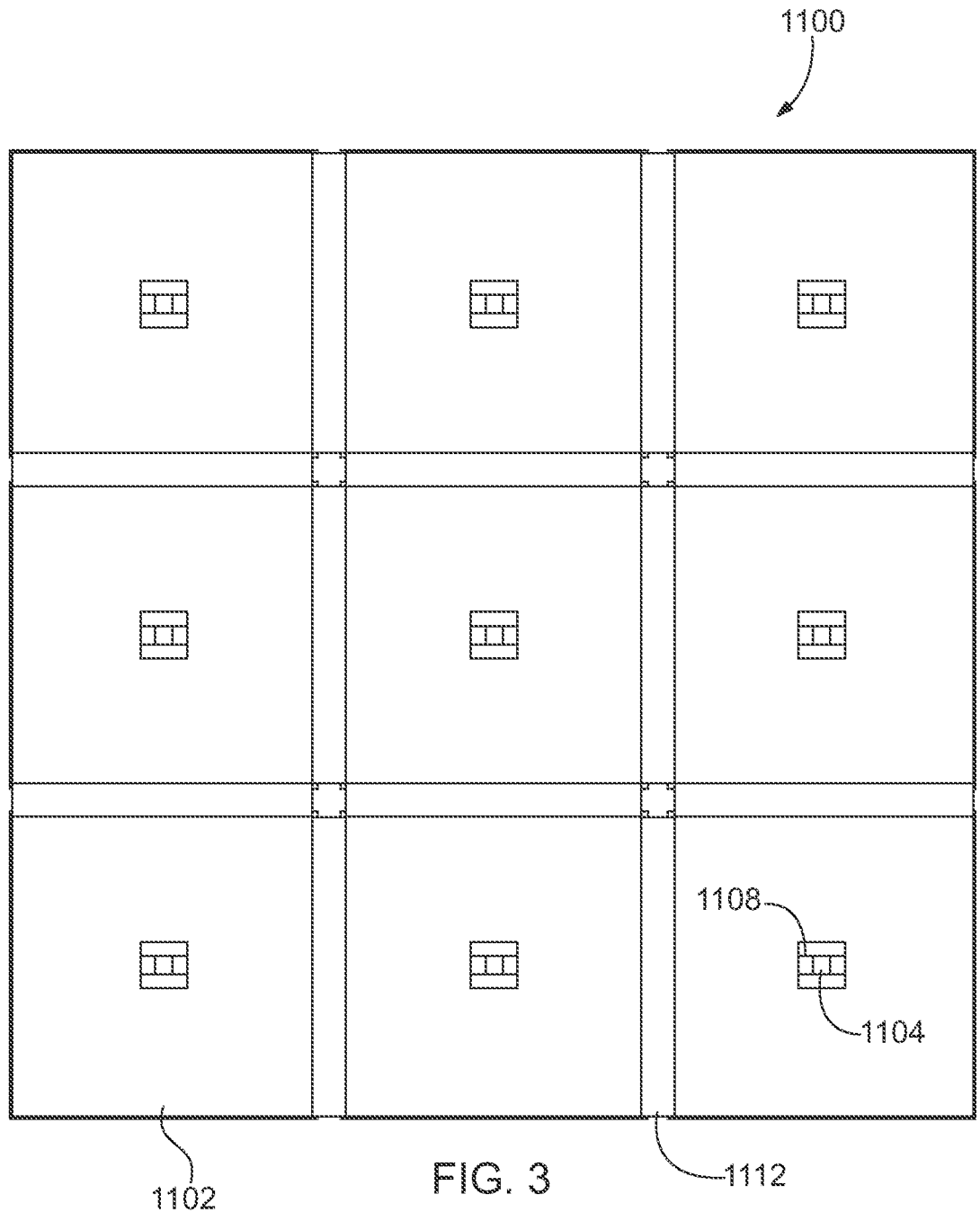
FIG. 3 schematically illustrates a top view of the array of ground plane tiles of FIG. 1.

Referring now to the figures, wherein like elements are numbered alike throughout, in one of its aspects the present invention provides structures and methods for alleviating CTE mismatch between semiconductor substrates or wafers and components mounted or formed thereon. For example, Applicant has recognized that there is a serious need for structures and methods to decouple the stress and strain in such devices. Such a solution is important to both wafer level packaging and chip scale and wafer scale solutions, e.g., for applications such as phased arrays, which often need complex antenna solutions and distribution networks that are interconnected down to pads and/or active devices formed in or on the semiconductor wafer. FIGS. 1-3 schematically illustrate an exemplary structure in accordance with the present invention—an array 1100 of ground plane tiles 1102 forming an electrically continuous ground plane with signal conductors 1104 that pass through each ground plane tile 1102 and one or more ground conductors 1106 mounted on, and electrically connected to, the ground plane tiles 1102. The signal conductors 1104 may be suspended using dielectric supports 1108 which may be a thermally conductive ceramic and may be embedded into the ground plane tiles 1102, FIG. 3. The dielectric supports 1108 may be strips partially embedded in the signal conductor 1104, but could be membranes or shaped differently. FIG. 2 shows a bottom isometric view of the array 1100 of ground plane tiles 1102 with the ground connections 1106 for connection to a semiconductor chip (e.g., a chip having a significantly lower CTE than copper). There could be as many as eight or more ground connections 1106 around each signal conductor 1104, or there could be as few as one or two, depending on the required impedance matching, design rules and other possible factors. In addition, the unit cells 1102 could house other circuits (whether passive or active) therein.

The ground plane tiles 1102 (collectively the ground plane) of the three-by-three array 1100 may be electrically connected by CTE-decoupling membranes 1112, in this case formed as U-shaped springs 1112. The gap between the ground plane tiles 1102 and signal line feedthrough, as well as the dimensions of the conductors 1104, can be electromagnetically designed, simulated and optimized with software such as HFSS™ or CST™ to ensure the signals or RF power may move from structures above the ground plane tiles 1102, such as antennas, to structures below the ground plane tiles 1102, such as semiconductor devices on or in or even below a wafer/chip region connected to these structures. Creating designs with such software can minimize impedance mismatch causing reflections and power loss. The ground plane tiles 1102 may be formed by PolyStrata® technology, comprising beam forming passives, that may include couplers, baluns, filters, splitters, combiners, and so on.

Although one signal conductor 1104 is shown centered in each ground plane tile 1102, multiple signal conductors 1104 could pass through each ground plane tile 1102, such as a pair of differential lines for a single polarization antenna or four feeds for a pair of differentially fed orthogonal polarizations. While the U-shaped spring regions 1112 cause local deviations from the flat conductive ground plane, by minimizing their electrical length, the antenna ground plane can look like an electrically-continuous ground plane operating to high frequencies. In addition to U-shaped spring regions 1112 extending into the positive Z direction, the spring regions 1112 could extend into the negative Z direction. Also, the spring regions 1112 could be 'V' shaped, or repeat in sequence, or use different suitable shapes. Thus, the present invention allows one to join two otherwise-CTE-mismatched structures, because at least one of the structures is comprised of unit cells 1102 that are connected by regions 1112 that behave as springs. If the thickness of the metal membranes 1112 is chosen properly, the membranes 1112 will contract and expand against the thermal expansion of copper, thus decoupling all or most of the thermal expansion induced stress from adjacent terminals, e.g., signal conductor 1104 and ground connections 1106, on each array element 1102. That is, the CTE mismatched structure(s) (for example a semiconductor wafer and PolyStrata® passives)

mounted on the array of unit cells 1102 no longer behave as rigid bulk slab(s) of different CTE being bonded together.

Figure 4:
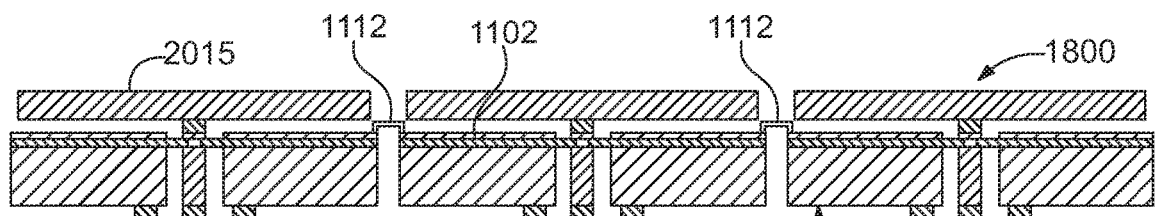
FIG. 4 schematically illustrates a cross-sectional view of an antenna array joined using CTE-decoupling features in accordance with the present invention, and associated FIGS. 4A-4O schematically illustrate cross-sectional views of an exemplary method in accordance with the present invention for creating the structure of FIG. 4.

An exemplary use of the ground plane array 1100 of the present invention is a wafer-scale phased array. FIG. 4 schematically illustrates a cross-sectional view of an antenna array 1800 comprising the ground plane array 1100 of FIG. 1 with the addition of antenna emitters 2015.

In general, wafer-scale phased arrays include electronic circuitry behind each antenna element to provide beam steering and signal amplification and are of roughly the same size as the unit cell of the antenna element, which is generally approximately half of a wavelength at the upper end of the frequency of operation, but may be less or more depending on the electronic scanning requirements of the particular application. Such an architecture eliminates some levels of packaging and testing and may be a best method of making phased arrays at upper millimeter-wave frequencies. For wafer-scale arrays, precision definition of metal features, including an electrically continuous ground plane across an area of a few wavelengths or more on a side at the top end of the frequency of operation may be required.

Copper is an excellent electrical conductor at the frequencies of interest for wafer-scale phased array antennas, such as in the millimeter-wave frequency range, but copper has a significantly different CTE compared to that of a semiconductor wafer or reticle to which the copper is connected. Because of the size of the interconnected metal and semiconductor materials, the size of the ground plane required makes it difficult to have a metal with a thickness greater than 25 microns bonded to the semiconductor wafer or reticle for structures more than a few millimeters. As such, a method to decouple the mechanical interface between the two materials will reduce the CTE mismatch stress induced as the assembly is subjected to a variety of temperatures.

Because of electrical skin depth limiting the penetration of electric fields into the conductors at higher frequencies, copper thicker than 25 microns may not be required to pass RF signals, but other factors (such as required height above a ground plane of the radiating structure of an antenna for radiation efficiency or bandwidth considerations, or protection of circuits from damage caused by ionizing radiation in space based applications) may mean that thicker metal may be more interesting than common thin-film or printed circuit board metal thickness values. In such cases, there is a desire to make an antenna that provides radiation shielding to an integrated circuit, while also limiting the front-end loss of the system. This is used to limit single-event upset-type failures from occurring in a space-based electronic system.

The PolyStrata® process may be a good way of creating such an antenna because copper is a high-density material; however, copper may not be the best way of doing this because it has a coefficient of thermal expansion (CTE) that is different than the bulk CTE of most integrated circuits. The idea of using tungsten, molybdenum or other metals that have a low coefficient of thermal expansion to create these antennas may solve the thermal expansion problem, but these metals may not be as easily formed as copper by a process such as the PolyStrata® process due to, for example, limitations of electroplating such metals. One advantage of including tungsten is that it has a density twice that of copper, which means that it can roughly provide the same shielding properties in half the thickness. This can decrease the overall height of an antenna assembly on an integrated circuit. Three-dimensional copper spring structures made using PolyStrata® fabrication technology can address the CTE problems present in applications ranging from wafer level packaging to wafer level phased array constructions.

If the passive PolyStrata® ground plane circuitry of the antenna array behaves mechanically as a continuous copper slab, the thermal stress induced by different rates of expansion between the semiconductor chip or wafer and PolyStrata® circuitry may cause the terminal connections to either fail or cause the semiconductor wafer to crack due to thermal expansion mismatch between the metal and semiconductor. The proposed disclosure attempts to solve this problem by mechanically isolating each elements of the array with membranes (or springs) 1112, FIGS. 1-3, while keeping the electrical and high frequency performance intact. A typical two dimensional spring will result in RF scattering and unwanted antenna behavior. Other fields of use for this technique and such structures may include any focal plane array where a two-dimensional pattern of pixels with a transducer and processing electronics at every pixel is required (at microwave or millimeter-wave frequencies these transducers are antennas, but these could be ultrasound transducers or infrared detectors, among other things). Although not a phased array, passive millimeter-wave imaging arrays also have repeating unit cells with electronics for each pixel and an antenna as a transducer. Alternatively, the CTE-compensating features in accordance with the present invention may be used to conform the array across a surface that has some amount of non planarity where electrical connections must be maintained across a wide area. Hence the spring-like features joining unit cells or die can operate not only in one plane, but compensate for non planarity or curvature in the axis orthogonal to the plane in which they are formed.

FIG. 4 shows a completed antenna array with antenna radiators 2015 connected to the signal conductors 1104 of the ground plane array 1100 of FIG. 1. Although the signal conductors 1104 are shown to connect to the center of the antenna radiators 2015, the signal conductors 1104 could be located in different positions or multiple signal conductors could be attached to the antenna radiators 2015. The antenna unit cells can extend in X and Y beyond what is shown, even if they are connected to something with a dissimilar CTE because of the CTE decoupling provided by the membranes or springs 1112.

Figure 4A:
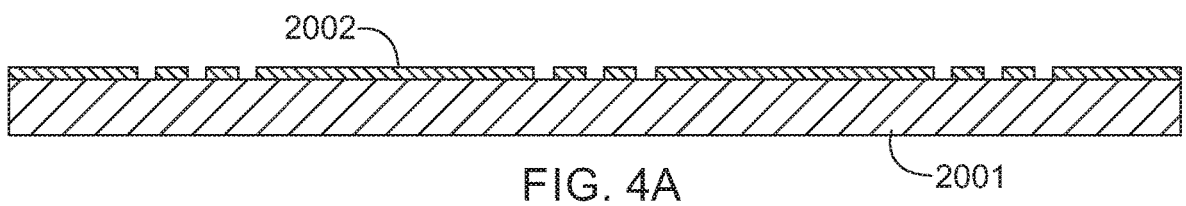
Figure 4B:
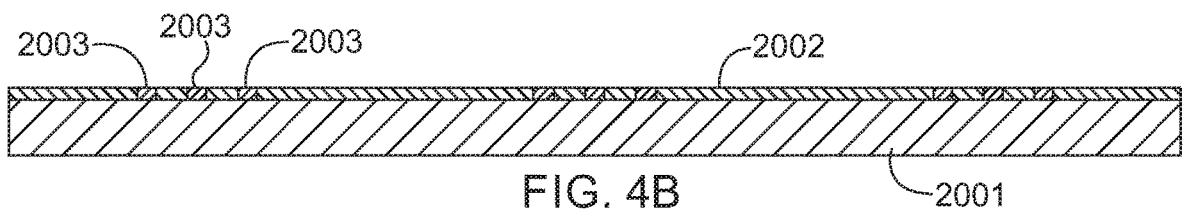
Figure 4C:
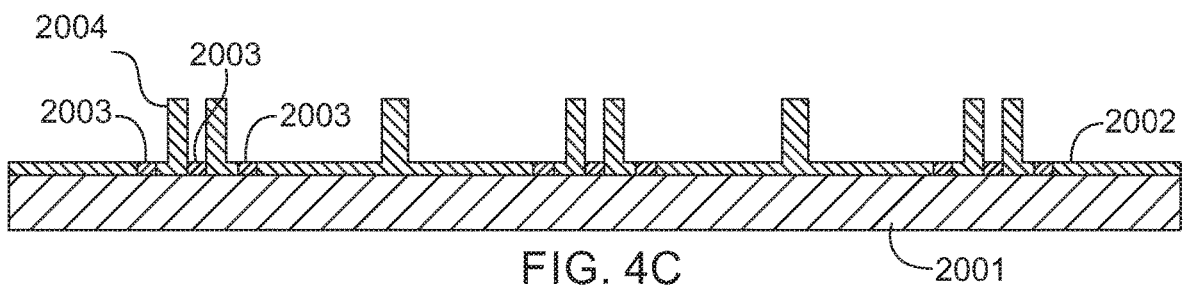
Figure 4D:
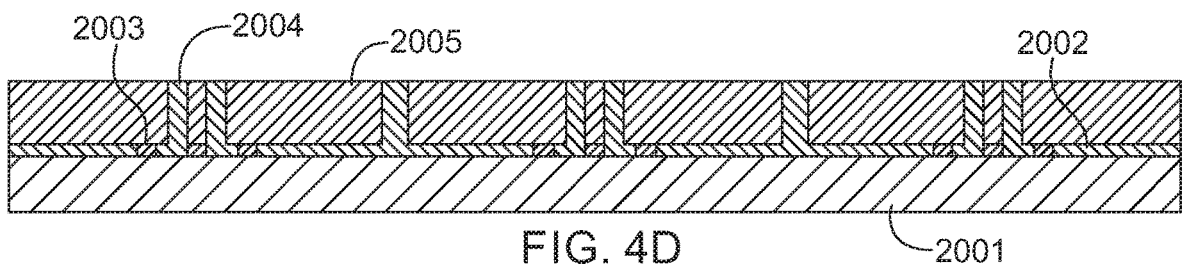
Figure 4E:
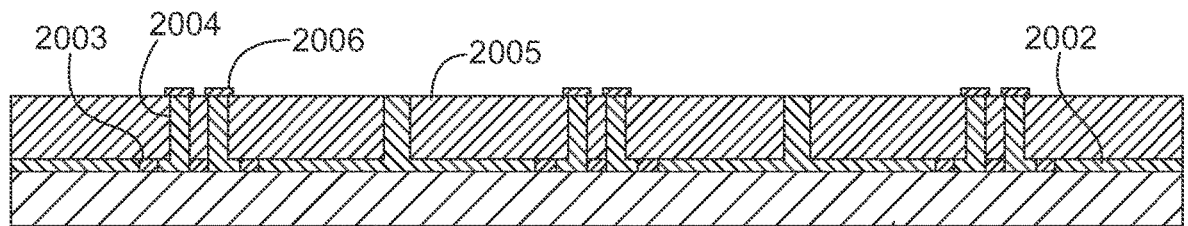
Figure 4F:
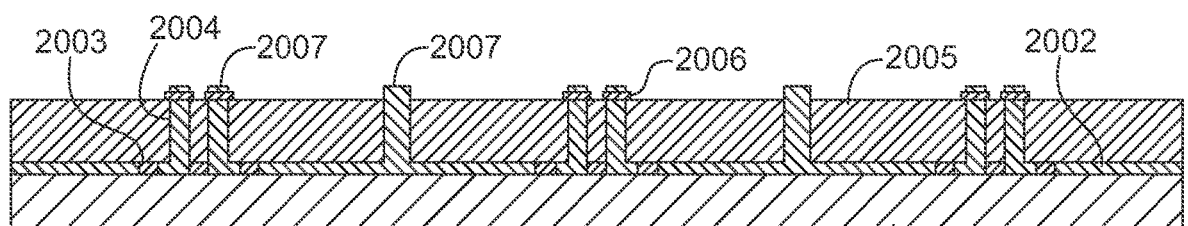
Figure 4G:
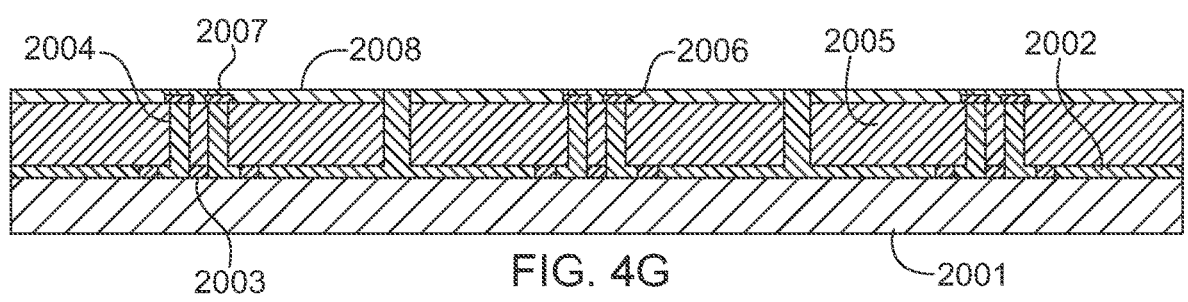
Figure 4H:
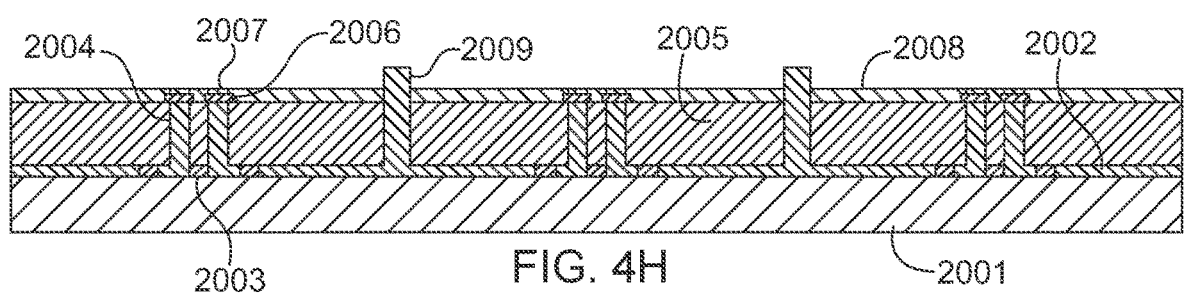
Figure 4I:
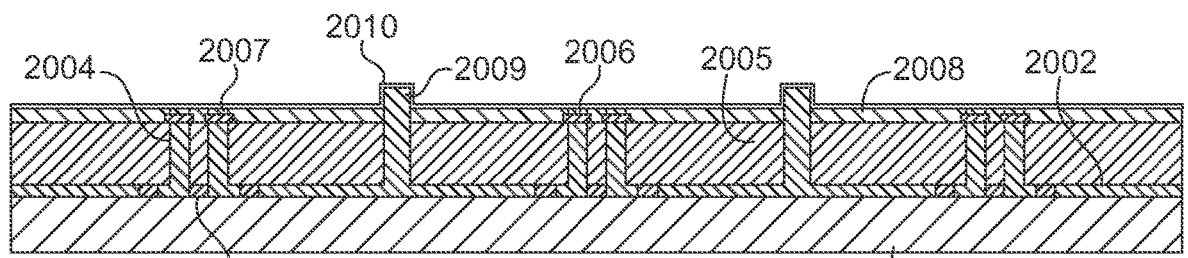
Figure 4J:
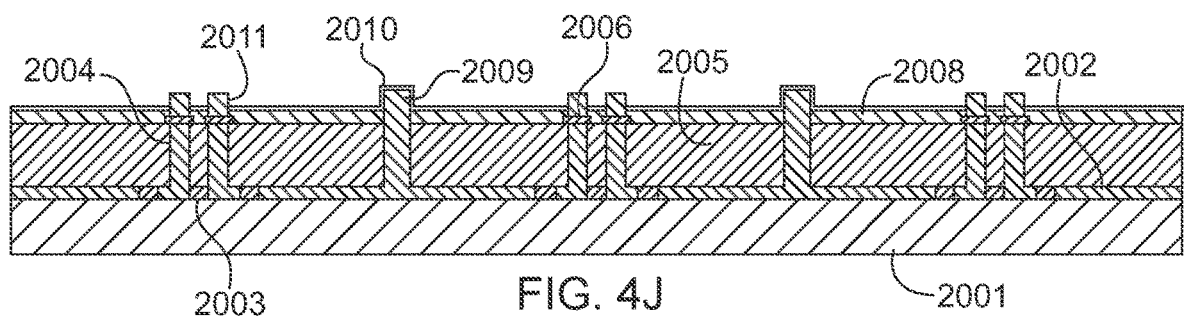
Figure 4K:
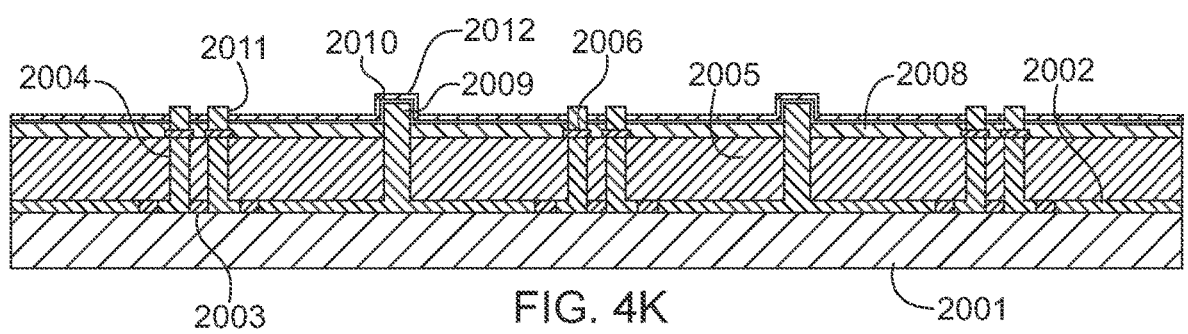
Figure 4L:
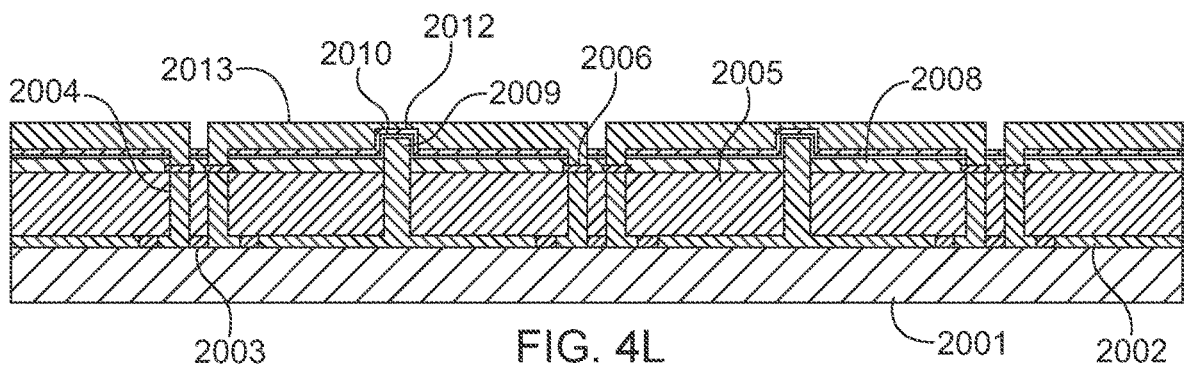
Figure 4M:
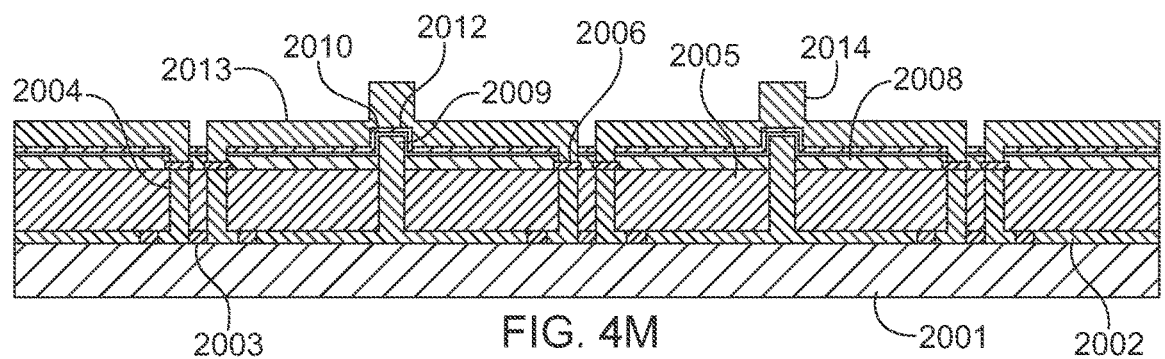
Figure 4N:
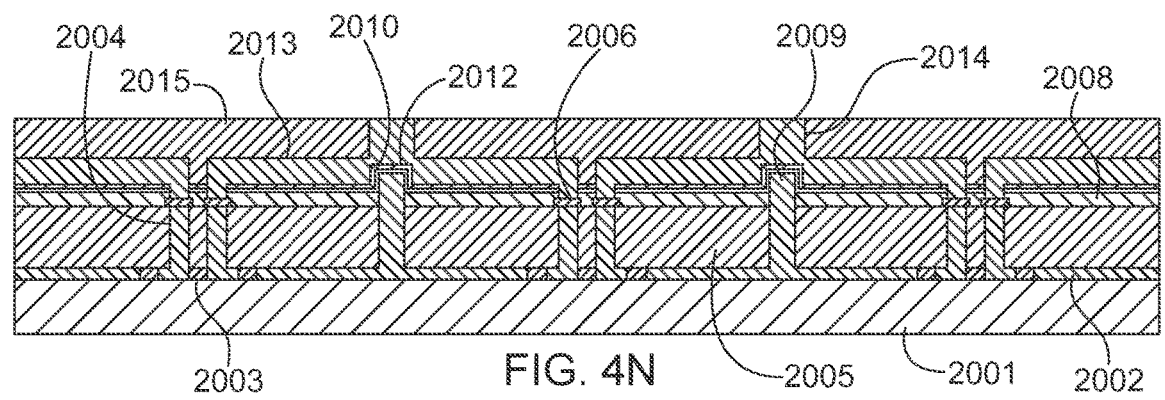
Figure 4O:
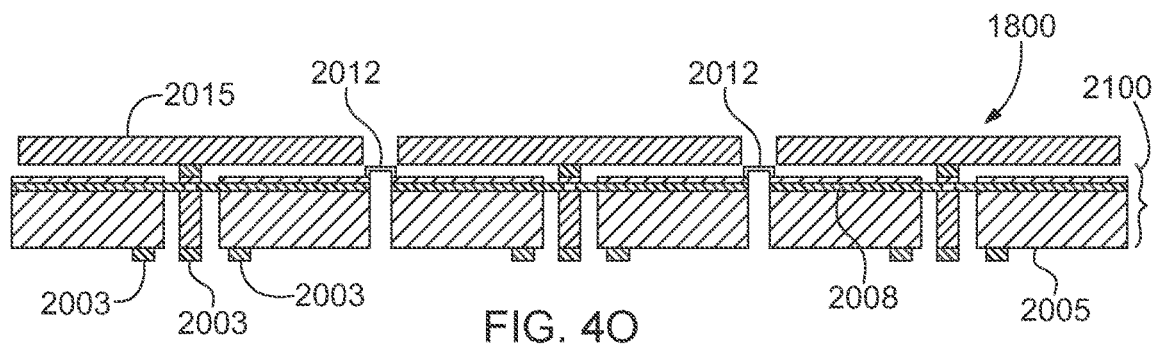

An exemplary process flow for fabricating the ground plane array 1100 shown in FIGS. 1-3 is provided in a step-by-step fashion in FIGS. 4A-4L, and an exemplary process flow for fabricating an antenna array 1800 is shown in FIGS. 4M-4O. The build steps are illustrated in an X-Z plane cross section. FIGS. 4A-4B show a photoimageable photoresist 2002 either laminated or spin coated over a temporary carrier substrate 2001. The photoresist 2002 is exposed to UV light, and a pattern is developed/formed by removing regions of photoresist using a photo-developer liquid. Electrode terminals 2003 are plated in locations where the photoresist 2002 has been removed. FIGS. 4C and 4D depict similar process steps to deposit or plate more metal and routing circuits. In FIG. 4C, photoresist is deposited in a relatively thicker layer, patterned, and non-desired portions removed to provide cavities defined by the remaining photoresist 2004. Metal 2005 is then deposited in the regions between the remaining photoresist 2004 to provide a ground plane structure, FIG. 4D. Dielectric supports 2006 are deposited to support the signal conductor on the ground plane metal 2004, FIG. 4E, in anticipation of future removal of the remaining photoresist 2004. In the PolyStrata® process, the supports 2006 are photopatternable.

FIGS. 4F-4G depict similar process steps of photoresist application, UV exposure, photo imaging, removal of non-desired portions of the photoresist to provide the remaining photoresist 2007, FIG. 4F, with the spaces in between the remaining photoresist 2004, 2007 plated with a metal 2008, FIG. 4G. Using similar techniques of photoresist application, UV exposure, photo imaging, and selective removal of photoresist, a ridge of photo resist 2009 is formed over remaining photoresist 2004, FIG. 4H. A conformal conductive seed layer 2010 is applied over the upper surface as shown in FIG. 4I in preparation for the deposition of additional metal. Additional photoresist 2011 may be provided in areas where metal plating is not desired by selectively depositing photoresist application, UV exposure, photo imaging, and selective removal, FIG. 4J. A conformal, thin membrane 2012 of copper may be applied in the areas where the seed layer 2010 is exposed and not covered by masking photoresist 2011, FIG. 4K. The thin copper membrane 2012 can provide a flexible three-dimensional membrane spring once the underlying photoresist 2009, 2004 is removed. Were the remaining photoresist 2004, 2007, 2009 and carrier substrate 2001 removed from the structure shown in FIG. 4K, the resulting structure would resemble ground plane array 1100 of FIGS. 1-3. However, the exemplary process of FIGS. 4A-4O continues in FIGS. 4L-4O to create the antenna array.

Specifically, FIGS. 4L-4N show a further set of photoresist coating, UV exposure, resist removal to provide photoresist 2013, 2014, after which a metal 2015 is provided in the gaps therebetween, where the shape of the metal 2015 is provided in the shape of antenna radiators 2015, FIG. 4O. All of the remaining photoresist 2004, 2007, 2009, 2013, 2014 and carrier substrate 2001 may be removed to provide the antenna array structure with ground plane array 2100 as shown in FIG. 4O. Instances of membranes or springs 2012 are shown as being flush with the top surface of the ground plane tiles 1102, but this is not necessary for all embodiments of the invention.

Figure 5:
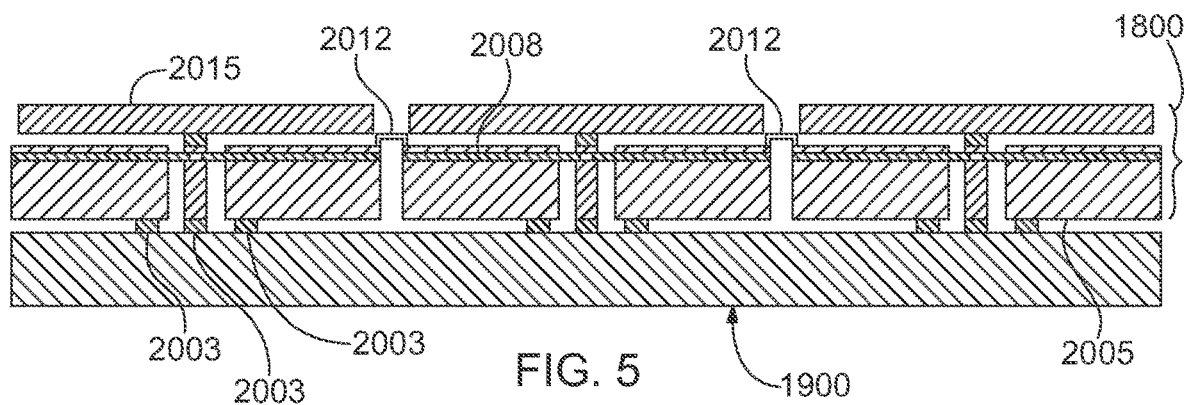
FIG. 5 schematically illustrates the antenna array of FIG. 4 attached to a semiconductor chip or wafer.

The antenna array 1800 may also be attached to a semiconductor chip or wafer 1900 using epoxy, solder or other suitable means, FIG. 5. The semiconductor chip or wafer 1900 could also be a ceramic or glass substrate, printed circuit board or other medium with an effective coefficient of thermal expansion that may be different from that of the antenna array 1800. In addition, although the steps shown in FIGS. 4A-4O indicate that the temporary carrier substrate 2001 may be removed to produce the antenna array 1800, by making the carrier substrate 2001 permanent, the full device shown in FIG. 5 may be created monolithically. In this case, semiconductor chip or wafer 1900 may be an active wafer, reticle or chip with integrated circuits or it may be a handle that provides rigidity and a known coefficient of thermal expansion that is set by the semiconductor chip or wafer 1900. If electrical through vias are put into the semiconductor chip or wafer 1900, the device of FIG. 5 could then be assembled into a larger system with antenna-element-level electrical connections to amplifiers or other electronics in an antenna system, whether an electronically-scanned phased array or otherwise. In addition, the semiconductor chip or wafer 1900 could serve as a barrier to prevent underfill material from penetrating the rest of the device or to provide a solder wick stop if the apparatus of FIG. 5 is bonded into a higher level assembly, to deter the flow of solder or other materials that may flow due to wicking back toward the antenna leads or connection points. An underfill material may be used to improve the reliability of the connections from the device of FIG. 5 to another package, but such materials may flow into regions they are not intended to penetrate.

Additionally, using multiple layers for the springs 2012 may suppress unwanted electromagnetic modes that may be supported in regions of air or vacuum between the membranes springs 2012 and semiconductor chip or wafer 1900. These modes may come from energy that leaks through the membranes or springs 2012, as it may not be physically continuous, although it is designed to be electrically continuous. The effect of these undesirable modes may appear or disappear depending on the electronic scanning conditions of the antenna array. This can effectively increase the frequency at which these electromagnetic modes are supported beyond the frequency band of interest for a given application.

Figure 6:
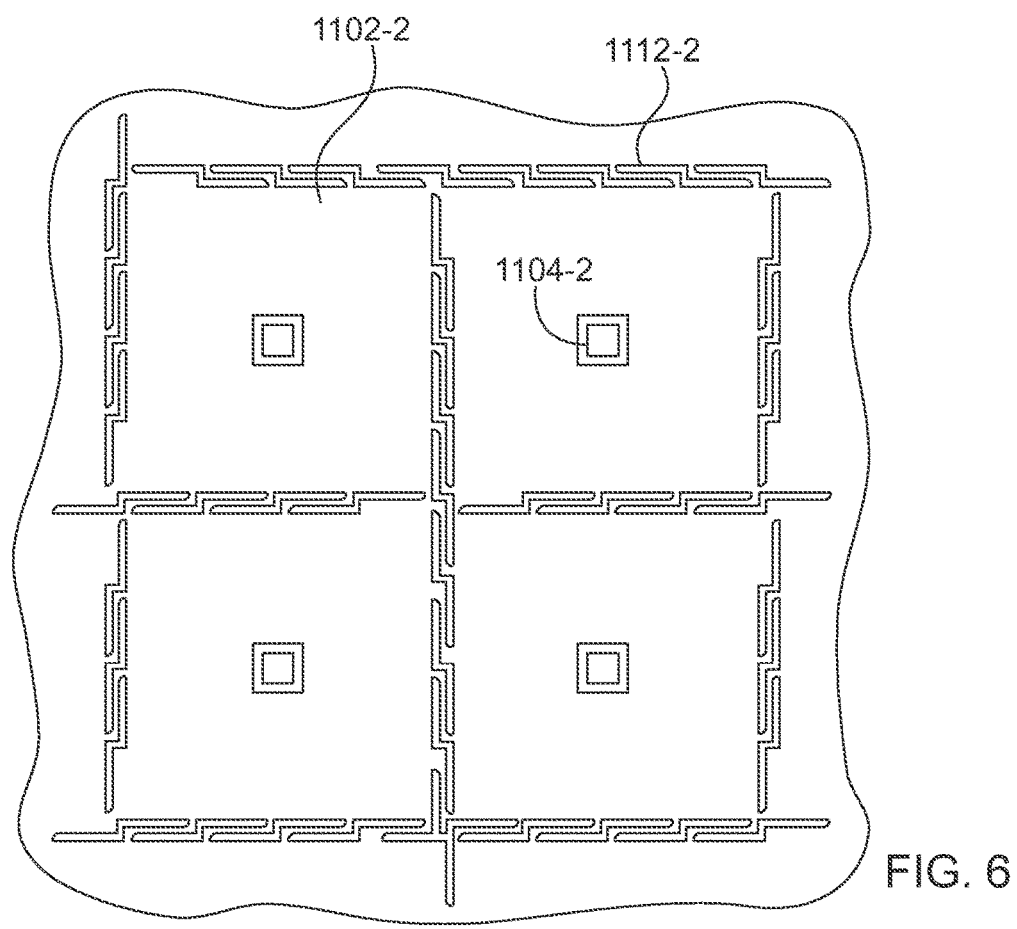
FIG. 6 schematically illustrates a top view of two-dimensional-spring connected ground plane tiles in accordance with the present invention.

In addition, the three-dimensional membrane 2012 formation, comprising the steps of FIGS. 4H-4L for example, two-dimensional springs 1112-2 may be provided between ground plane tiles 1102-2 with center conductors 1104-2, which springs 1112-2 may not be as efficient either mechanically or electrically, but nevertheless represents another embodiment of the present invention for providing mechanical decoupling while maintaining electrical connections, FIG. 6. The 2-dimensional springs 1112-2 having a serpentine shape and can provide similar methods of CTE decoupling can be provided as has been described in FIGS. 1-5; however, the aspect ratio of the metal and gap definition attainable using a particular fabrication process may constrain the ability of the designer to create springs 1112-2 with minimal impact on the overall performance of the antenna array or circuit. This is due to the additional inductance inherent in the springs 1112-2 compared to the springs 1112.

In addition, the ground plane tiles 1102-2 and springs 1112-2 can serve a dual purpose. First, the ground plane tiles 1102-2 and springs 1112-2 may provide an essentially electrically continuous ground plane over the frequencies of interest. The features of the springs 1112-2 and the gaps may be sized to be electrically small compared to the operating wavelength, so the ground plane of tiles 1102-2 appears continuous to the antenna elements. An electrically continuous ground plane can be important to the antenna's electrical performance. Second, the spring features allow for thermal expansion mismatch between a mainly-copper part (e.g., Poly Strata® part) and a substrate with significantly different thermal expansion, e.g., silicon, SiC, alumina, Low Temperature Cofired Ceramic (LTCC), etc. The springs 1112-2 may allow a part and/or a substrate adjoined thereto to thermally expand in-plane with different rates. The springs 1112-2 can flex to allow the individual ground plane tiles 1102-2 to move relative to one another without putting undue stress either within the ground plane itself. Additionally, the springs 1112-2 can flex to deter stress between the ground plane and attached structures, including, for example: a metal part (e.g., PolyStrata® part); the bonded electrical junction between the part and a substrate below, e.g., a wafer; and/or, an antenna radiator structure. The effect of the springs 1112-2 on a bonded electrical joint, such as that to a semiconductor wafer, can have a negligible effect on the joint's fatigue life, and can survive the required number of thermal cycles that would be expected during qualification testing and on-orbit lifetime for a typical spacecraft mission.

Figure 7:
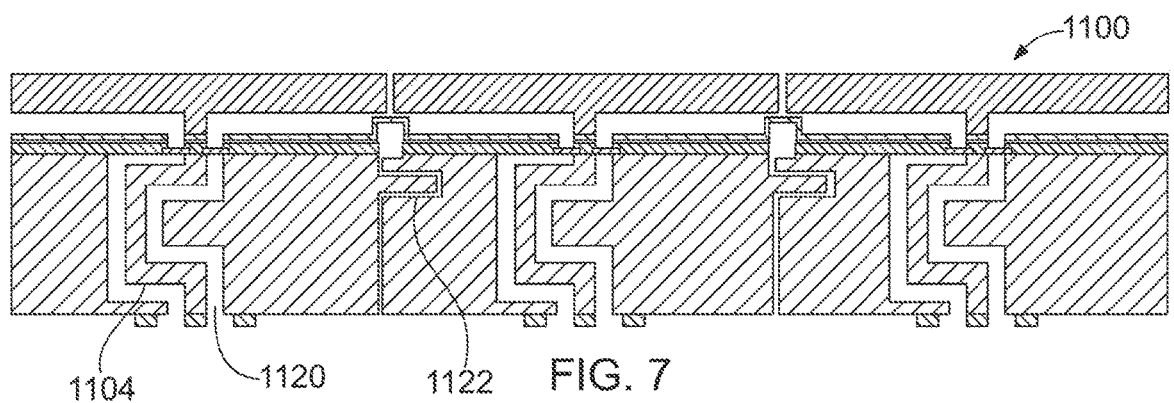
FIG. 7 schematically illustrates cross-sectional views of a version of the structure of FIG. 4 with staggered features to increase overall radiation shielding effectiveness.

FIG. 7 schematically illustrates a modification to the apparatus shown in FIG. 4 to improve radiation shielding across the entire device surface. By making a jog 1120 along the path of the center conductor 1104, the regions of lowest line-of-sight radiation shielding have higher shielding levels. Item 1122 is a shield staggering feature in the CTE decoupling structure region. This lowers the effective shielding in those areas where the staggering occurs, but if the gaps between material of adjacent unit cells can be minimized, the reduction of shielding is minimized. With reference to FIG. 5, if the radiation shielding capability of the antenna array for the circuits on 1900 is important, it is possible to ensure those circuits most sensitive to ionizing radiation damage are not placed directly under the U-shaped spring regions 1112 or other areas with less shielding.

Figure 8A:
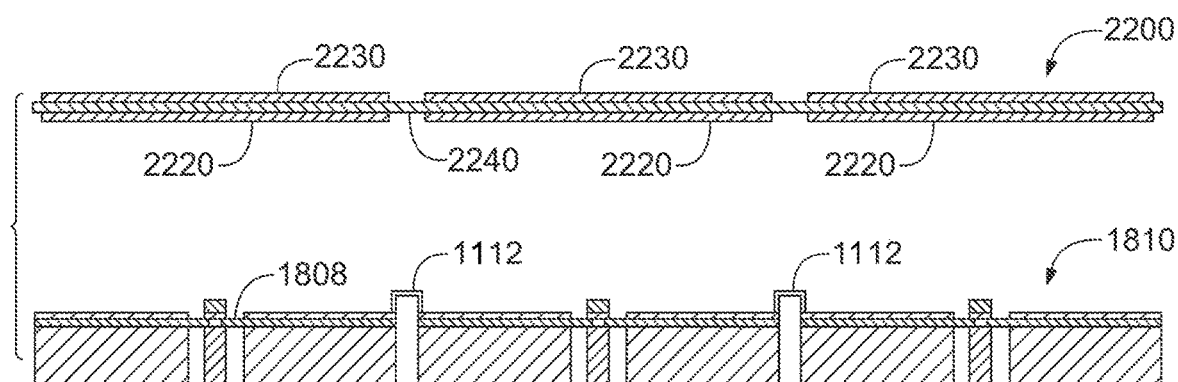
FIGS. 8A, 8B schematically illustrate cross-sectional views of a singulation technique in accordance with the present invention showing its use in creating an antenna array similarly structured to that of FIG. 4.
Figure 8B:
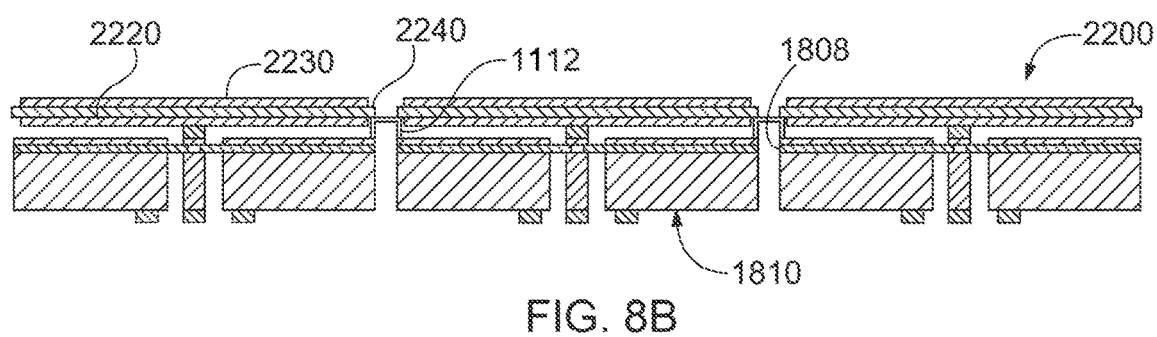

In yet a further aspect of the present invention, an array of antenna radiators may be provided using a singulation technique as illustrated in FIGS. 8A, 8B. A continuous array 2200 of antenna radiators may be provided that may include a bottom-side metal pattern 2220, a top-side metal pattern 2230, and circuit board 2240, FIG. 8A. The bottom-side and top-side metal patterns 2220, 2230 may be generally periodic and repeat on the antenna unit cell pitch. It is possible to not have a pattern on one or both sides of the board 2240, and there could be multiple pads on one side of the board (for instance in a case where two pads from the bottom-side metal pattern are capacitively coupling through the board 2240 to the topside metal pattern 2230). The continuous radiator array 2200 may be bonded to the ground plane array 1100 shown in FIG. 1 or the ground plane 1810 of FIG. 4, FIG. 8B. The individual unit cells may be separated from each other by laser ablation or using a dicing saw to decrease the amount of continuous circuit board material to reduce stress induced by CTE differences over the entire length of the continuation array 2200, as the antenna circuit board material is broken into unit-cell-sized pieces, FIG. 8B. By bonding a single continuous radiator array 2200 to the rest of the structure before singulation of the unit-cell-size pieces, there are fewer assembly steps than if each unit-cell-sized piece were assembled individually. As the size of the gap between adjacent unit cells can be small (on the order of 25 microns), the overall electrical effect of making the circuit board material discontinuous can be minimal.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. For example, while fabrication via PolyStratax technology has been mentioned, other methods of photolithography-based fabrication, 3d printing or other fabrication techniques could be employed in accordance with the present invention. Alternatively, the previous discussion has focused on the spring-like features being included in the material that has the higher CTE; however, through bulk micromachining (or other methods), the spring features could be integrated into the lower-CTE device bonded (such as silicon). It should therefore be understood that this invention is not limited to the particular embodiments described herein, but is intended to include all changes and modifications that are within the scope and spirit of the invention as set forth in the claims.

What is claimed is:

1. A microelectronic structure having CTE compensation for use in wafer-level and chip-scale packages, comprising:
 a plurality of substrate tiles each having a generally planar upper surface, the upper surfaces of the tiles disposed within a common plane to provide a generally planar grid of the tiles, each respective pair of adjacent tiles having a gap disposed therebetween;
 a spring structure spanning the gap and connecting the adjacent tiles, the spring structure configured to permit movement of the adjacent tiles relative to one another to provide compensation for thermal expansion or contraction of the tiles;
 a respective opening extending through each substrate tile from the upper surface to an opposing lower surface;
 an electrically conductive post extending through each opening from the upper surface to the lower surface; and
 a device layer attached above the upper surfaces of the common plane, the device layer comprising a three-dimensional metal structure which includes a plurality of antenna radiators each disposed on a respective one of the conductive posts, with each antenna radiator suspended above the common plane.

2. The microelectronic structure of claim 1, wherein the substrate tiles comprise a semiconductor material.

3. The microelectronic structure of claim 1, wherein the substrate tiles comprise metal.

4. The microelectronic structure of claim 1, wherein the spring structure comprises a membrane.

5. The microelectronic structure of claim 1, wherein the spring structure comprises a 2-dimensional serpentine structure.

6. The microelectronic structure of claim 1, wherein the spring structure comprises a metal.

7. The microelectronic structure of claim 1, wherein the spring structure comprises a U-shaped membrane having a longitudinal axis that is disposed parallel to an edge of the upper surface of the selected tile to which the U-shaped membrane is attached.

8. The microelectronic structure of claim 1, wherein the spring structure comprises a non-planar structure having a central region that extends upward above the common plane.

9. The microelectronic structure of claim 1, wherein the spring structure is attached to the upper surfaces of the adjacent tiles.

10. The microelectronic structure of claim 1, comprising a dielectric material disposed on the common plane and disposed within the gap.

11. The microelectronic structure of claim 1, wherein the device layer comprises one or more of resistors, capacitors, and inductors.

12. The microelectronic structure of claim 1, wherein the three-dimensional metal/dielectric structures include one or more of coaxial waveguides, Wilkinson combiner/dividers, Gysel combiner/dividers, and filters.

13. The microelectronic structure of claim 1, wherein the device layer is attached to the upper surfaces with a dielectric material disposed therebetween.

14. The microelectronic structure of claim 1, wherein the plurality of tiles each comprise multiple adjacent layers of metal disposed in direct contact to one another parallel to the upper surface.

15. The microelectronic structure of claim 1, wherein the plurality of tiles is electrically continuous.

16. The microelectronic structure of claim 1, comprising a semiconductor chip or wafer attached to the lower surface and electrically connected to the conductive posts to electrically connect the chip or wafer to the antenna radiators.

17. The microelectronic structure of claim 16, wherein the wafer comprises one or more of ceramic substrate, a glass substrate, and a printed circuit board.

18. A method of forming a three-dimensional microstructure by a sequential build process, comprising:
 disposing a plurality of layers over a substrate, wherein the layers comprise one or more layers of a conductive material and one or more layers of a sacrificial material, thereby forming a structure above the substrate, the structure comprising the microelectronic structure of claim.

19. The method of claim 18, wherein the spring structure is formed of the conductive material.

20. The method of claim 18, comprising removing the sacrificial material.

21. The method of claim 18, comprising removing the substrate.

22. The method of claim 18, wherein the spring structure comprises a membrane.

23. The method of claim 18, wherein the spring structure comprises a 2-dimensional serpentine structure.

24. The method of claim 18, wherein the spring structure comprises a U-shaped membrane having a longitudinal axis that is disposed parallel to an edge of the upper surface of the selected tile to which the u-shaped membrane is attached.

25. The method of claim 18, wherein the spring structure comprises a non-planar structure having a central region that extends upward above the common plane.

26. The method of claim 18, wherein the spring structure is attached to the upper surfaces of the adjacent tiles.

27. The method of claim 18, wherein the step of disposing a plurality of layers over a substrate comprises disposing one or more layers of a dielectric material.

28. The method of claim 18, wherein the substrate comprises one or more of ceramic substrate, a glass substrate, and a printed circuit board.

29. The method of claim 18, wherein the device layer comprises one or more of resistors, capacitors, inductors, and the three-dimensional metal/dielectric structures.

30. The microelectronic structure of claim 29, wherein the three-dimensional metal/dielectric structures include one or more of coaxial waveguides, antennas, Wilkinson combiner/dividers, Gysel combiner/dividers, and filters.

31. The method of claim 18, wherein the tiles each comprise a lower surface opposing the upper surface and comprising electrically connecting a semiconductor chip or wafer to the lower surface.

32. The microelectronic structure of claim 1, wherein the spring structure includes a sheet of material that extends across, and is flush with, the upper surfaces of the plurality of substrate tiles.

33. The microelectronic structure of claim 1, wherein the spring structure includes a membrane of metal disposed conformally over the upper surfaces of the plurality of substrate tiles to provide a flexible three-dimensional membrane spring.

34. The microelectronic structure of claim 1, comprising a sacrificial material disposed in the gaps between each pair of adjacent tiles, the sacrificial material extending upward above the uppers surfaces of the tiles to provide a spring support, wherein the spring structure is conformally disposed over the spring support.

35. The microelectronic structure of claim 34, wherein the sacrificial material comprises photoresist.

36. The microelectronic structure of claim 1, comprising a radiator gap between adjacent antenna radiators and wherein the radiator gap is disposed above, and in registration with, the gap between adjacent tiles.

37. The microelectronic structure of claim 1, comprising a radiator gap between adjacent antenna radiators and wherein the radiator gap is disposed above, and in registration with, the spring structure.

* * * * *